(12) United States Patent
Kimura et al.

(10) Patent No.: US 8,395,386 B2
(45) Date of Patent: Mar. 12, 2013

(54) MAGNETIC RESONANCE IMAGING APPARATUS AND RF COIL UNIT

(75) Inventors: Tokunori Kimura, Yaita (JP); Mitsukazu Kamata, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 505 days.

(21) Appl. No.: 12/774,143

(22) Filed: May 5, 2010

(65) Prior Publication Data

US 2011/0043206 A1 Feb. 24, 2011

(30) Foreign Application Priority Data

Aug. 20, 2009 (JP) ................................. 2009-191371
Mar. 25, 2010 (JP) ................................. 2010-070754

(51) Int. Cl.
*G01V 3/00* (2006.01)
(52) U.S. Cl. ..................................................... 324/307
(58) Field of Classification Search .......... 324/300–322; 600/407–445
See application file for complete search history.

(56) References Cited

U.S. PATENT DOCUMENTS

| 6,845,342 | B1 * | 1/2005 | Basser et al. ................... 702/183 |
| 7,723,987 | B2 * | 5/2010 | Bito et al. ...................... 324/309 |
| 7,906,964 | B2 * | 3/2011 | Fleysher et al. ............... 324/309 |
| 2004/0030240 | A1 | 2/2004 | Kimura |
| 2005/0065432 | A1 | 3/2005 | Kimura |
| 2008/0077006 | A1 | 3/2008 | Katscher et al. |
| 2011/0044524 | A1 * | 2/2011 | Wang et al. .................... 382/131 |
| 2011/0187367 | A1 * | 8/2011 | Feiweier et al. ............... 324/309 |

OTHER PUBLICATIONS

Takahara et al., "Diffusion Weighted Whole Body Imaging with Background Body Signal Suppression (DWIBS): Technical Improvement Using Free Breathing, STIR and High Resolution 3D Display", Radiation Medicine: vol. 22, No. 4, 275-282 pages, (2004).

* cited by examiner

*Primary Examiner* — Brij Shrivastav
(74) *Attorney, Agent, or Firm* — Nixon & Vanderhye PC

(57) ABSTRACT

According to one embodiment, a magnetic resonance imaging apparatus includes a correction data acquisition unit configured to perform diffusion weighted imaging to a phantom having a known apparent diffusion coefficient and measure an apparent diffusion coefficient of the phantom to acquire correction data from a measured apparent diffusion coefficient and the known apparent diffusion coefficient, and an image generating unit configured to perform diffusion weighted imaging to an object with a same parameter setting as that of the diffusion weighted imaging to the phantom to generate an apparent diffusion coefficient image from a diffusion weighted imaging data of the object and the correction data.

28 Claims, 18 Drawing Sheets

MAGNETIC RESONANCE IMAGING APPARATUS AND RF COIL UNIT

CROSS-REFERENCE TO RELATED APPLICATIONS

This application claims the benefit of priority of Japanese Patent Application No. 2009-191371, filed Aug. 20, 2009, and No. 2010-070754, filed Mar. 25, 2010, the entire contents of which are incorporated herein by reference.

FIELD

Embodiments described herein generally relates to a magnetic resonance imaging system and an RF coil unit.

BACKGROUND

Magnetic resonance imaging is imaging procedure which reconstructs an image from the MR signal generated by exciting magnetically the nuclear spin of the object placed in the static magnetic field with the RF signal of Larmor frequency.

In the magnetic resonance imaging, physical quantities, such as an apparent diffusion coefficient (ADC) and a fractional anisotropy (FA) in the diffusion weighted imaging (DWI), a longitudinal relaxation (T1) value, a transverse relaxation (T2) value, proton density, temperature, the amount of chemical shifts, blood flow volume, oxygen concentration and so forth, can be measured, and improvement of measurement accuracy of these physical quantities has been required strongly.

In particular, the DWI is often used as a functional imaging method which can image an infarction part or a cancer part. In the DWI, the diffusion behavior of a molecule is imaged by applying a MPG (motion probing gradient) pulse, using the fact that the phase of a proton changes with the diffusive motion of a molecule. As a sequence for the DWI, EPI (echo planar imaging) sequence is used widely.

In the DWI, a lesion part, such as an infarction part or a tumor part, and normal parts can be distinguished according to the degree of diffusion.

However, since a T1 component and a T2 component are mixed into an image of the DWI, it is said to be difficult to determine an exact symptom from the image of DWI. Thus, parameters called ADC and FA, which are quantitative parameters showing only a diffusion effect, are used in many cases.

For example, the ADC value of a cerebral infarction part in an acute stage or a tumor part may become lower than the ADC value in a normal part in many cases. When screening of cancer is conducted by DWI, a quantitative image, such as an image of ADC or an image of FA, are generated from, for example, a wide range of volume data of the whole body (for example, refer to non-patent literature, "Takahara T, Imai Y, Yamashita T, Yasuda S, Nasu S, Van Cauteren M., Diffusion weighted whole body imaging with background body signal suppression (DWIBS): technical improvement using free breathing, STIR and high resolution 3D display. Radiat Med. 2004 July-August; 22(4):275-82").

An image of ADC is generated from two or more images of DWIs, each corresponding to a different b value.

On the other hand, an image of FA is generated from two or more images of DWIs produced by applying MPG pulses in at least 6 axial directions which are different from each other to obtain b values. Here, the b value indicates an amount of the signal attenuation by diffusion.

As an index showing malignancy of cerebral infarction or cancer, quantification and standardization of ADC or FA, have been sought after.

Meanwhile, there is a technique which standardizes the display of an index indicating malignancy of lesion parts, such as cerebral infarction or cancer, only with an image of DWI. In this technique, an image which expresses the index is corrected, using a signal collected from specific regions, such as thalamus, which are considered to be a normal part in a head, as a reference value.

However, as mentioned above, the image of DWI does not necessarily include only quantitative parameters which indicate a diffusion effect. That is, T1 component and T2 component are mixed into the image of DWI.

In addition, the size of the imaging region and signal strength of the image of DWI differ from an object to another.

As a result, the index obtained simply from the image of DWI may include an error, and may not exactly show the malignancy of a lesion part.

Further, when an image of DWI is obtained by an EPI sequence, the image of DWI may cause a distortion or an error of signal strength due to an eddy current yielded by a MPG pulse with a strong gradient magnetic field or nonlinearity of a gradient magnetic field.

As a result, the ADC value and FA value calculated based on the image of DWI having such a distortion or an error of signal strength will also be shifted from true values, depending on tissues.

In addition, the error of the ADC value or FA value has a spatial distribution, i.e., a spatially non-uniform distribution.

When imaging a tissue in which a signal value is small while ADC is large, there is also a problem that a signal value becomes large due to a noise and causes a calculation error.

Furthermore, an error similar to the above-mentioned error produced in the image of ADC or FA may be produced also when quantitatively measuring other physical quantity by MRI.

The error in measuring quantitatively a physical quantity varies depending on imaging conditions, such as which equipment is used, what type of equipment is used, and when the imaging is performed, resulting in an impairment of diagnosis.

Therefore, even for different imaging conditions, such as an individual property of the equipment, a type of the equipment, and an imaging timing, it is necessary to stably acquire a diagnosing image without distortion to measure quantitatively physical quantity in a simple manner and with high precision.

DETAILED DESCRIPTION

According to one embodiment, a magnetic resonance imaging apparatus includes a correction data acquisition unit configured to perform diffusion weighted imaging to a phantom having a known apparent diffusion coefficient and measure an apparent diffusion coefficient of the phantom to acquire correction data from a measured apparent diffusion coefficient and the known apparent diffusion coefficient, and an image generating unit configured to perform diffusion weighted imaging to an object with a same parameter setting as that of the diffusion weighted imaging to the phantom to generate an apparent diffusion coefficient image from a diffusion weighted imaging data of the object and the correction data.

Embodiments of a magnetic resonance imaging apparatus and an RF coil unit will be described in detail with reference to the accompanying drawings.

(Configuration and Operation)

Figure 1:
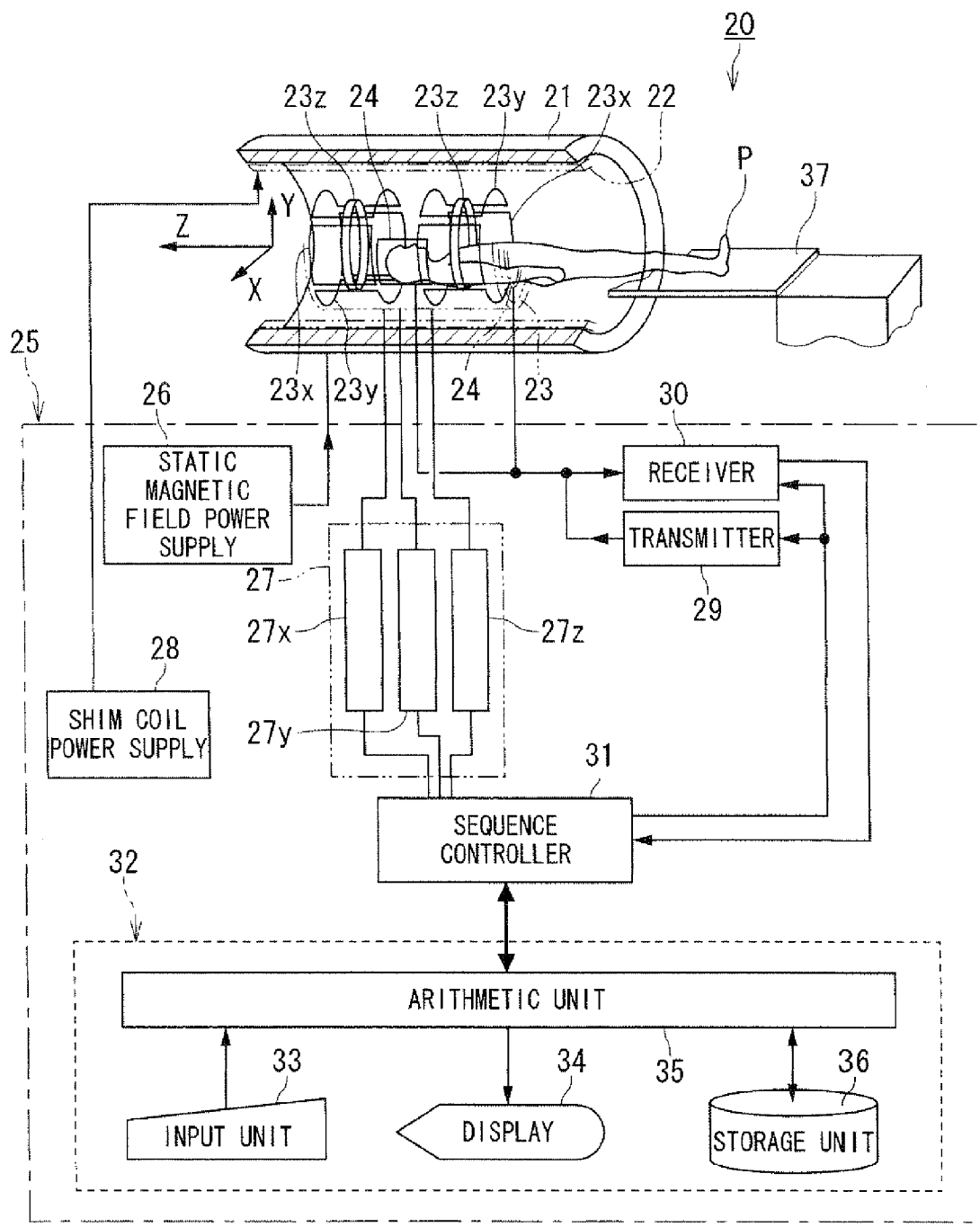
FIG. 1 shows an example of a configuration of the magnetic resonance imaging apparatus according to an embodiment of the present invention.

FIG. 1 is a block diagram showing a configuration of an embodiment of the magnetic resonance imaging apparatus 20. The magnetic resonance imaging apparatus 20 is provided with a cylindrical static-magnetic-field magnet 21 which forms a static magnetic field, a shim coil 22 inside the static-magnetic-field magnet 21, a gradient coil 23, and an RF coil 24.

The magnetic resonance imaging apparatus 20 is also provided with control system 25. The control system 25 is provided with a static magnetic field power supply 26, a gradient magnetic field power supply 27, a shim coil power supply 28, a transmitter 29, a receiver 30, a sequence controller 31, and a computer 32.

The gradient magnetic field power supply 27 of the control system 25 includes an X-axis gradient magnetic field power supply 27x, a Y-axis gradient magnetic field power supply 27y, and a Z-axis gradient magnetic field power supply 27z.

The computer 32 is provided with an input unit 33, a display 34, an arithmetic unit 35, and a storage unit 36.

The static-magnetic-field magnet 21 is connected to the static magnetic field power supply 26 to form a static magnetic field in an imaging region by the current supplied from static magnetic field power supply 26.

In many cases, the static-magnetic-field magnet 21 is build up with a superconductive coil in many cases, and connected to the static magnetic field power supply 26 to be supplied with current for magnetization. After static-magnetic-field magnet 21 is magnetized, the static-magnetic-field magnet 21 is usually disconnected from the static magnetic field power supply 26.

Alternatively, the static-magnetic-field magnet 21 may be build up with a permanent magnet, and for this case, the static magnetic field power supply 26 is not needed.

Inside the static-magnetic-field magnet 21, a coaxial and cylindrical shim coil 22 is provided. The shim coil 22 is connected to a shim coil power supply 28, and equalizes a static magnetic field by the current supplied from the shim coil power supply 28.

The gradient coil 23 includes X-axis gradient coil 23x, Y-axis gradient coil 23y, and Z-axis gradient coil 23z, and is formed in a cylindrical shape inside of the static-magnetic-field magnet 21.

Bed 37 is provided inside the gradient coil 23, and the inside of the gradient coil corresponds to an imaging region. Object P is laid on the bed 37.

The RF coil 24 includes a local coil for receiving provided near the bed 37 or the object P, a whole body coil (WBC) for receiving/transmitting provided in the gantry, and so forth.

The gradient coil 23 is connected with gradient magnetic field power supply 27. The X-axis gradient coil 23x, the Y-axis gradient coil 23y, and the Z-axis gradient coil 23z of the gradient coil 23 are connected with a X-axis gradient magnetic field power supply 27x, a Y-axis gradient magnetic field power supply 27y, and a Z-axis gradient magnetic field power supply 27z of the gradient magnetic field power supply 27, respectively.

With the current supplied to X-axis gradient coil 23x, Y-axis gradient coil 23y, and Z-axis gradient coil 23z, respectively from X-axis gradient magnetic field power supply 27x, Y-axis gradient magnetic field power supply 27y, and Z-axis gradient magnetic field power supply 27z, the gradient magnetic field Gx of an X axial direction, gradient magnetic field Gy of Y axial direction, and gradient magnetic field Gz of Z axial direction are formed in an imaging region, respectively.

The RF coil 24 is connected with a transmitter 29 and/or a receiver 30. A transmitting RF coil 24 transmits an RF signal sent from the transmitter 29 to the object P. On the other hand, a receiving RF coil 24 receives a NMR signal generated from the nuclear spin in the object P due to excitation by the RF signal, and sends the NMR signal to the receiver 30.

In respect to the receiving RF coil 24, a local coil corresponding to each imaging purpose such as a head-use coil or a specialized coil, can be detached and attached around a human body.

In particular, the magnetic resonance imaging apparatus 20 according to the present embodiment is provided with a receiving RF coil 24 which can allow a reference phantom to be fixed thereto or inserted thereinto, while the receiving RF coil 24 can be detached and attached around a human body.

Figure 2:
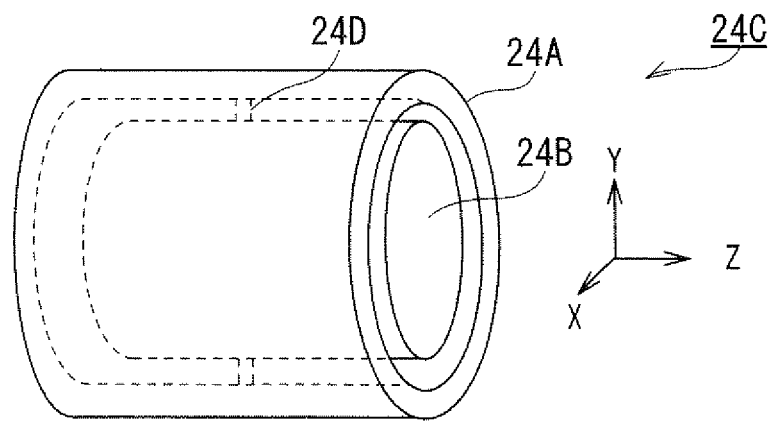
FIG. 2 shows an example of a configuration of a receiving RF coil, which can be used as the RF coil shown in FIG. 1, fixed to a phantom-for-independent-imaging.
Figure 3:
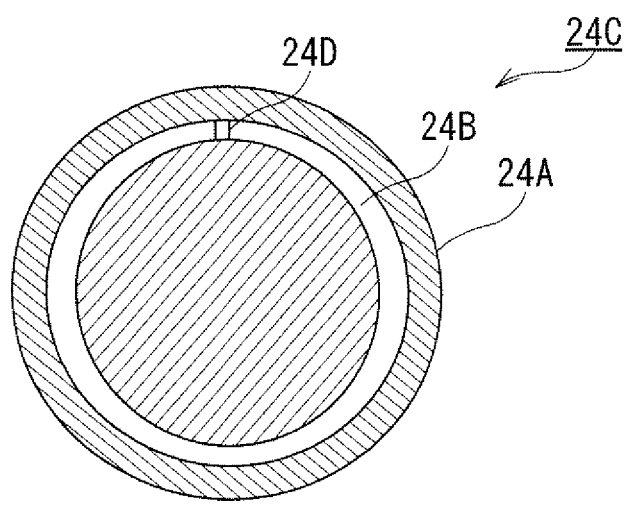
FIG. 3 is a transverse cross section diagram of the RF coil unit fixed to the phantom-for-independent-imaging shown in FIG. 2.

FIG. 2 shows an example of the configuration of the receiving RF coil to which a phantom-for-independent-imaging is fixed, as an example of RF coil 24 shown in FIG. 1. The "phantom-for-independent-imaging" implies a phantom which is imaged independently of a human body. FIG. 3 is a transverse cross section diagram of an RF coil unit to which the phantom-for-independent-imaging shown in FIG. 2 is fixed.

As shown in FIG. 2 and FIG. 3, RF coil unit 24C can be constituted by inserting a pillar-shaped reference phantom 24B, the longitudinal direction of which corresponds to Z axial direction, into a cylindrical receiving RF coil 24A. The reference phantom 24B can be integrated with the receiving RF coil 24A using arbitrary fixing means to the object P. FIG. 2 and FIG. 3 show the example in which the reference phantom 24B is fixed to the receiving RF coil 24A using a fixture 24D. The reference phantom 24B may be fixed to the receiving RF coil 24A using the fastening means such as a Hook-and-Loop fastener or an adhesive.

By forming the reference phantom 24B to be a size equivalent to a field of view (FOV), or a size which fully covers a field of view, as shown in FIG. 2 and FIG. 3, the NMR signal from the reference phantom 24B can be acquired from the whole field of view.

As a result, the reference phantom 24B can be used as a phantom-for-independent-imaging for imaging only a phantom, without setting a human body.

Figure 4:
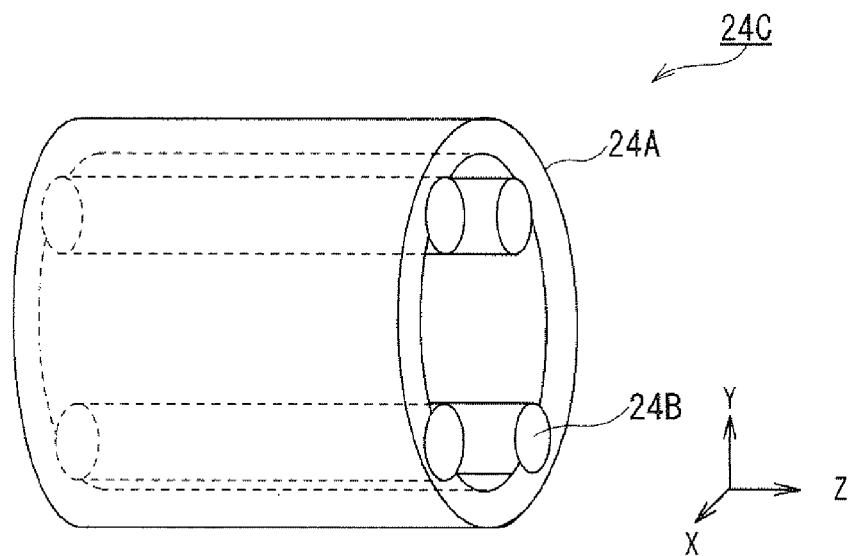
FIG. 4 is a figure showing an example of a configuration of the receiving RF coil available as an RF coil shown in FIG. 1, to which the phantom-for-simultaneous-imaging is fixed.

On the other hand, plural reference phantoms 24B can also be fixed to or inserted into the receiving RF coil 24. FIG. 4 is a figure showing an example of a configuration of a receiving RF coil, available as an RF coil shown in FIG. 1, to which a phantom-for-simultaneous-imaging is fixed. The phantom-for-simultaneous-imaging implies a phantom which can be simultaneously imaged with a human body. Hereinafter, the phantom-for-simultaneous-imaging is simply referred as the phantom-for-simultaneous-imaging.

Figure 5:
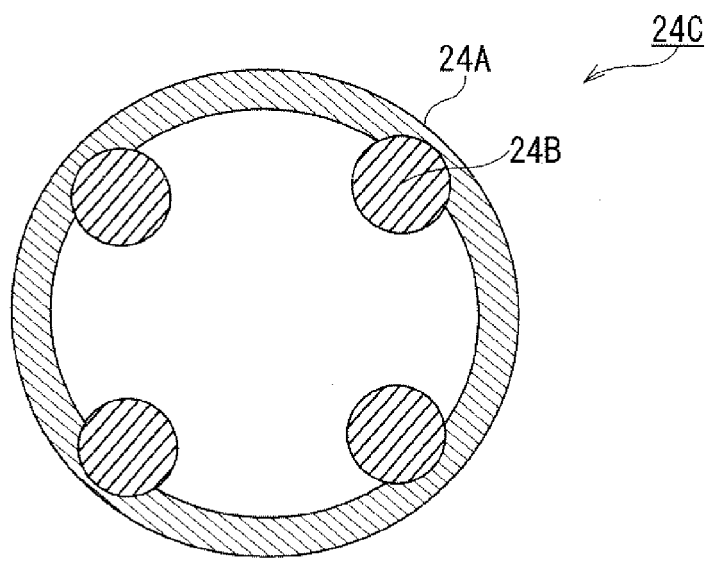
FIG. 5, is a transverse cross section diagram of the RF coil unit shown in FIG. 4.

FIG. 5 is a transverse cross section diagram of the RF coil unit shown in FIG. 4.

As shown in FIG. 4 and FIG. 5, the RF coil unit 24C can be constituted by setting four pillar-shaped reference phantoms 24B to the predetermined positions of four corners on the x-y plane inside the receiving RF coil 24A. Longitudinal direction of each of the reference phantoms 24B corresponds to Z axial direction. Each reference phantom 24B may be referred to as a phantom unit.

The number of reference phantoms 24B is arbitrary. However, from the viewpoint of the accuracy of data processing as mentioned below, it is desirable for each reference phantom 24B to be arranged uniformly at the outer circumference of the receiving RF coil 24A.

It is also preferred to arrange the reference phantom 24B at the position in the phase encoding (PE) direction where no ghost can occur. Then, the artifact does not occur, and it becomes possible to acquire favorable image data of the reference phantom.

In addition, when the shape of each reference phantom 24B is pillar-shaped such that the longitudinal direction corresponds to z axial direction, it becomes possible to use all the data from each reference phantom 24B for data processing in imaging processing at each z-axial position.

The reference phantom 24B may be arrange to the periphery inside the receiving RF coil 24A, and the size of the receiving RF coil 24A may be adjusted, so that a human body can be set in the receiving RF coil 24A, as shown in FIG. 4 and FIG. 5.

With this arrangement, it is possible to set a human body into the receiving RF coil 24A and to image the reference phantom 24B and the human body as object P simultaneously. That is, the reference phantom 24B can be used as a phantom-for-simultaneous-imaging.

The above mentioned multiple (or single) reference phantom(s) 24B can be arranged in the imaging region side of receiving RF coil 24 having various forms and applications.

Figure 6:
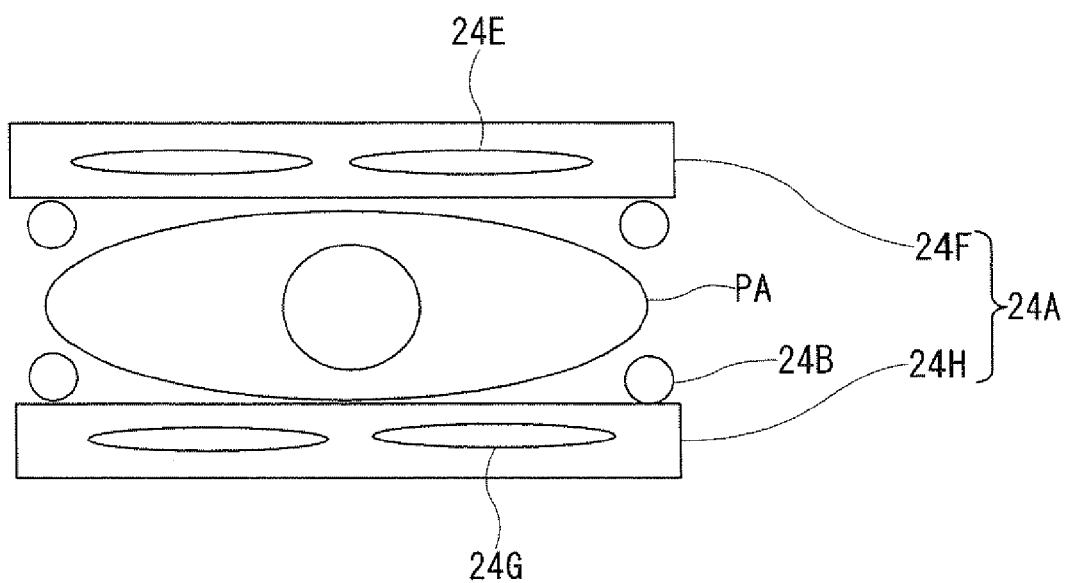
FIG. 6 is a diagram showing another example of the configuration of the RF coil, which can be used as an receiving RF coil shown in FIG. 1, to which plural phantoms-for-simultaneous-imaging is fixed.

FIG. 6 is a diagram showing another example of the configuration of the receiving RF coil, which can be used as an RF coil shown in FIG. 1, to which plural phantoms for simultaneous imaging are fixed. As shown in FIG. 6, single or multiple reference phantom(s) 24B may be arranged between a spine coil 24F, having plural coil components 24E, at the back side of the human body PA and a body coil 24H, having plural coil components 24G, at the top side of the human body PA so that the human body PA can be set therebetween. FIG. 6 shows the example in which four reference phantoms 24B are provided.

The phantom-for-independent-imaging 24B as shown in FIGS. 2 and 3 can also be provided in the imaging region side of the receiving RF coil 24 of FIG. 6.

It is desirable that the material of reference phantom 24B is uniform material which has a physical quantity value close to the physical quantity of an object to be measured.

It is also desirable that the material of the reference phantom 24B has sufficiently small amount of chemical shifts from a resonant frequency of water so that the resonant frequency of the reference phantom 24B can be regarded as being same as, or at least close to the resonant frequency of water, resulting that favorable signal from a phantom can be obtained without suppression in scanning accompanied by fat suppression.

One of the examples of the material of reference phantom 24B is polytetrafluoroethylene (PTFE) which includes dimethylsulfooxide (DMSO).

When plural reference phantoms 24B are provided in the receiving RF coil 24, it may be effective, from a viewpoint of accuracy of data processing, that each of the plural reference phantoms 24B has not only close value to the value of the physical quantity used as a measuring object, but also has physical quantity which is different from each other.

For example, when measuring the ADC value of a tissue of a human body as physical quantity, plural reference phantoms 24B, of which ADC value is known, having different ADC values around the ADC value of the tissue to be measured may be preferable.

In the case that it is predicted that the actually realized b value in DWI does not have spatial distribution, or in the case that even if the actually realized b value has spatial distribution, the distribution function is expressed as a low degree function, such as liner function, a single type of material for the reference phantom 24B is sufficiently effective.

Further, in the case that the relation between the preset b value and the actually realized b value can be regarded as linear relation, or in the case that the relation between the true value of ADC and the measured value of ADC can be regarded as linear relation, a single type of material for the reference phantom 24B is also sufficiently effective.

In contrast, in the case that the ADC value of the object to be measured varies in a certain amount of range and the b values are preset at several steps, in the case that it is predicted that the relation between the preset b value and the actually realized b value can be regarded as non-linear relation, or in the case that it is predicted that the relation between the true value of ADC and the measured value of ADC can be regarded as non-linear relation, a reference phantom 24B made of materials having plural ADC values may be effective for performing data processing with high precision, as mentioned below.

Figure 7:
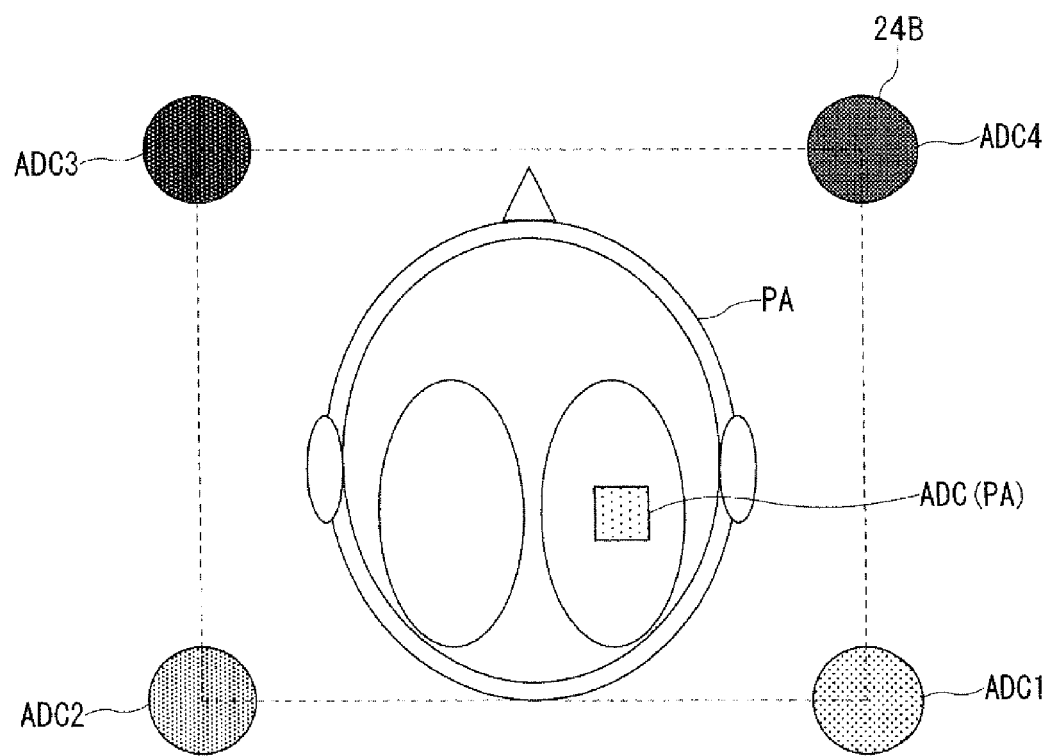
FIG. 7 shows an example of the configuration in which four reference phantoms each having different ADC value are provided in the imaging region side of the receiving RF coil.

FIG. 7 shows an example of the configuration in which four reference phantoms 24B each having different ADC value are provided in the imaging region side of the receiving RF coil 24.

As shown in FIG. 7, four reference phantoms 24B are provided in the imaging region side of receiving RF coil 24. Each reference phantom 24B has one of different ADC values close to the ADC value of human body (ADC (PA)), ADC1, ADC2, ADC3, and ADC4. This configuration enables the data correction processing to perform with high precision.

In addition, by forming each reference phantom 24B to be in a pillar-shape such that the longitudinal direction corresponds to z axial direction, it is possible to use all the data from each reference phantom 24B for data processing in imaging processing at each z-axial position. For example, each ADC value may be set as follows: ADC=0.5, 1.0, 1.5, and 2.0 [$\times 1.0^{-3}$ mm$^2$/s].

Figure 8:
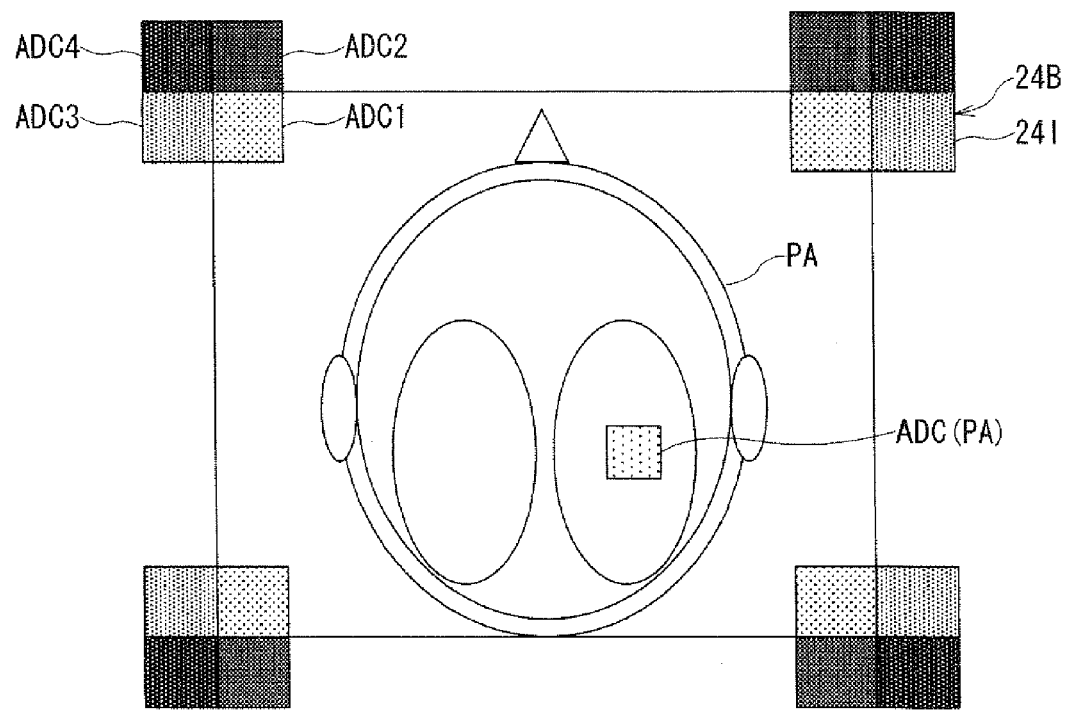
FIG. 8 shows an example of the configuration in which reference phantoms having four different ADC values are provided at four places in the imaging region side of the receiving RF coil.

FIG. 8 shows an example of the configuration in which reference phantoms 24B, which are configured so that plural sub-phantom units (four units in an example of FIG. 8) each having different ADC values are arranged adjacently to each other, are provided at four places in the imaging region side of the receiving RF coil 24.

When the b value has low degree of spatial distribution, or the b value and/or the ADC value has nonlinearity, such a configuration, as shown in FIG. 8, that reference phantoms 24B each having different ADC values are provided at different places in the imaging region inside the receiving RF coil 24 is effective to perform highly precise data processing, because spatial distribution of the b value and non-linearity of the ADC value are reflected into the data processing.

FIG. 8 shows an example in which four square-pillar-shaped reference phantoms 24B each having four different ADC values are provided in four places. Each of different ADC values of the reference phantoms 24B is set to a value close to the ADC value of human body (ADC (PA)).

In other words, the reference phantom 24B is divided into plural reference phantoms 24B, and is disposed within an region where each is at substantially the same positions, while the ADC value of each reference phantom 24I are determined to be different from one another.

The number of the sets of the reference phantoms 24B arranged at a different position corresponds to the degree of the spatial distribution of physical quantity. For example, if it can be assumed that the spatial distribution of physical quantity is a linear distribution, the sets of reference phantoms 24I may be arranged in at least three places. Even for the case in which the spatial distribution of physical quantity is linear, if the sets of the reference phantoms 24I are arranged at four places, more exact data processing can be performed.

Generally, physical quantity, such as ADC, is the functions of temperature. Thus, the ADC value at a temperature around 25 degrees C. within the gantry of the magnetic resonance imaging apparatus 20 in a scanner room may be a reference value.

If necessary, physical quantity, such as ADC value, may be measured with temperature at every actual imaging, and the measured physical quantity may be converted into the physical quantity at a predetermined temperature from the relation between temperature and physical quantity.

As mentioned above, it is desirable, from the view point of the accuracy of data processing, to form a phantom-for-independent-imaging with the material which has a physical quantity close to that of an object to be measured.

In addition, data processing will become simpler if the material of the phantom-for-independent-imaging is the same as the material used as a phantom-for-simultaneous-imaging.

When there are two or more kinds of material used as a phantom-for-simultaneous-imaging, the phantom-for-independent-imaging can be formed from a material, among the two or more kinds of material, which shows an average physical quantity of the tissue of the human body as an object to be measured.

Returning to FIG. 1, the sequence controller 31 of control system 25 is connected with the gradient magnetic field power supply 27, the transmitter 29, and the receiver 30.

The sequence controller 31 has a function to memorize sequence information which includes control information, such as strength of pulse current, applying period, applying timing, etc., necessary to drive a gradient magnetic field power supply 27, transmitter 29, and receiver 30.

The sequence controller 31 also has a function to generate X-axis gradient magnetic field Gx, Y-axis gradient magnetic field Gy, Z-axis gradient magnetic field Gz, and an RF signal, by driving the gradient magnetic field power supply 27, the transmitter 29, and the receiver 30 according to the memorized predetermined sequence.

The receiver 30 detects and A/D (analog to digital) converts the NMR signal to generate raw data, which are complex data. The sequence controller 31 receives the raw data from the receiver 30 and then sends the raw data to the computer 32.

The transmitter 29 sends an RF signal to the RF coil 24 based on the control information received from the sequence controller 31.

As mentioned above, receiver 30 generates the raw data which is the digitized complex data, by detecting the NMR signal received from RF coil 24, and performing the necessary signal processing and carrying out the A/D conversion. Then, the receiver 30 sends the raw data to the computer 32. Computer 32 realizes a various function by executing the program saved at storage unit 36 of the computer 32 with arithmetic unit 35.

The magnetic resonance imaging apparatus 20 may realize the various functions, not using the program but using specific electronic circuits.

Figure 9:
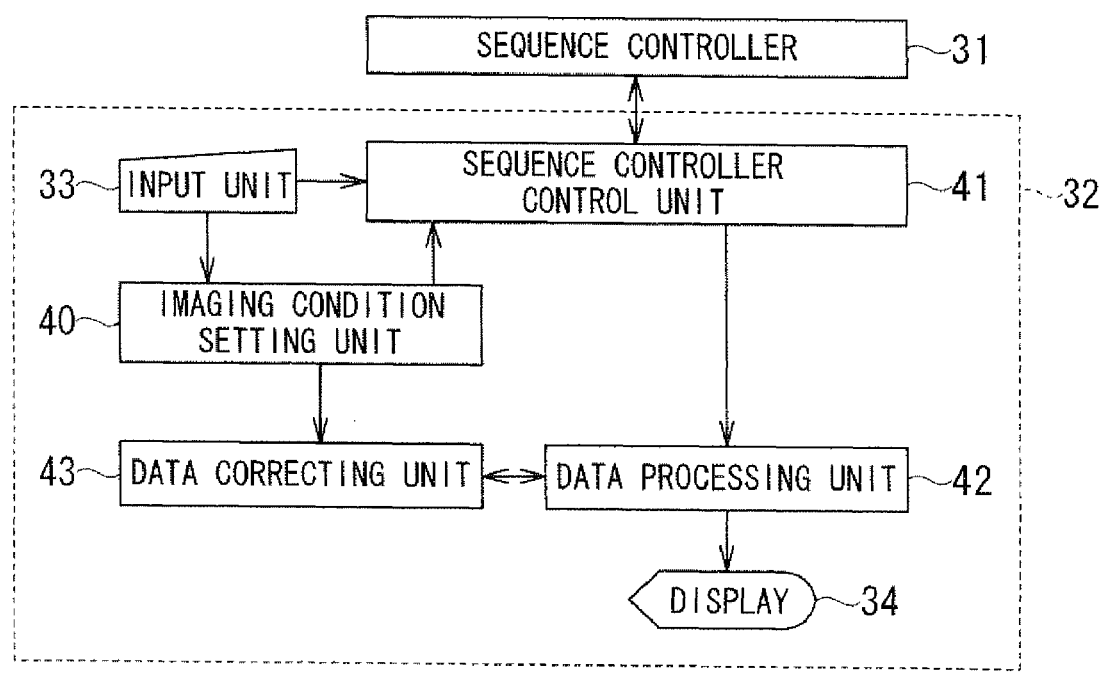
FIG. 9 is a functional block diagram of the computer shown in FIG. 1.

FIG. 9 is a functional block diagram of the computer 32 shown in FIG. 1.

The computer 32 functions, by a program, as an imaging condition setting unit 40, a sequence controller control unit 41, a data processing unit 42, and a data correcting unit 43. The imaging condition setting unit 40 sets the imaging conditions, including a pulse sequence, based on the instruction information from the input unit 33, and sends the set imaging conditions to the sequence controller control unit 41. Among the above units, the data processing unit 42 and the data correcting unit 43 together functions as a correction data acquisition unit and an image generating unit.

When scan start instruction information from the input unit 33 is received, the sequence controller control unit 41 controls the sequence controller 31 by giving the imaging conditions acquired from the imaging condition setting unit 40 to the sequence controller 31.

The sequence controller control unit 41 also receives the raw data from the sequence controller 31, and arranges the raw data in the k-space formed in the data processing unit 42.

The data processing unit 42 reconstructs image data from the k-space data by performing image reconstruction processing which includes a Fourier transform (FT). The data processing unit 42 also acquires physical quantity, such as ADC value, FA value, T1 value, T2 value, proton density, temperatures, chemical shift amount, blood flow volume, and oxygen concentration, based on the image data produced by reconstructing.

Further, the data processing unit 42 performs necessary image processing to image data, such as known processing for correcting distortion due to application of the gradient magnetic field, a signal strength correction processing, a maximum intensity projection (MIP) processing, and a multiplanar reconstruction (MPR) processing.

Furthermore, the data processing unit 42 corrects the error of parameter values, such as the b value, caused by the non-linearity of a gradient magnetic field, and also displays the image data and the physical quantity on the display 34.

The data correcting unit 43 acquires, from data processing unit 42, the phantom image data received from the receiving RE coil 24A provided with a phantom-for-independent-imaging or a phantom-for-simultaneous-imaging. The data correcting unit 43 then generates the b value, the ADC value, etc. in DWI, based on the acquired phantom image data, and sends them to data processing unit 42.

(Operation and Effect)

Next, operation and effect of the magnetic resonance imaging apparatus 20 will be explained.

In the following, examples of the case will be specifically described where accuracy of measurement of the quantitative values, such as the ADC value and the FA value are increased by performing the correction of the b value or the ADC value along with the correction of the distortion in the image of the DWI, which is considered to be here especially important in MRI.

Although not explained in detail here, when performing diffusion tensor imaging (DTI), it is also possible to use ADC value and an image of the DTI which are corrected in the same procedure as that of the DWI.

First, the case will be explained where the accuracy of measurement of quantitative values, such as ADC value, and an image of DWI is increased by correcting the b value.

In general, there exists the following relation between pixel signal strength S of an image of DWI, b value, and ADC value.

$$ADC=\ln(S0/S)/b$$

Here, S0 is the pixel signal strength of an image of DWI in the case that the b value equals to zero, i.e., a MPG (Motion Probing Gradient) pulse is not applied, and S is the pixel signal strength of an image of DWI obtained when the MPG pulse corresponding to the b value is applied.

The b value is determined by gradient magnetic field strength G of a MPG pulse, applying period δ of the MPG pulse, and time period Δ from the start time of the first MPG pulse to the start time of the next MPG pulse. The b value can be preset by setting these parameters G, δ, and Δ.

However, since the gradient magnetic field strength G usually has spatial distribution, the b value also has spatial distribution in the range of an imaging region. Thus, the realized b value does not necessarily coincide with the preset b value, and the realized b value has an error which has spatial distribution.

In addition, the relation between the preset b value and the realized b value is not necessarily linear, but sometimes non-linear.

Then, if the relation between the preset b value and the realized b value is acquired as correction data from an image data of a phantom, it is possible to estimate the realized b value from the preset b value using the correction data.

It is also possible to obtain the true (corrected) ADC value of a human body from the estimated realized b value and the pixel signal strength of the image of DWI of the human body.

Figure 10:
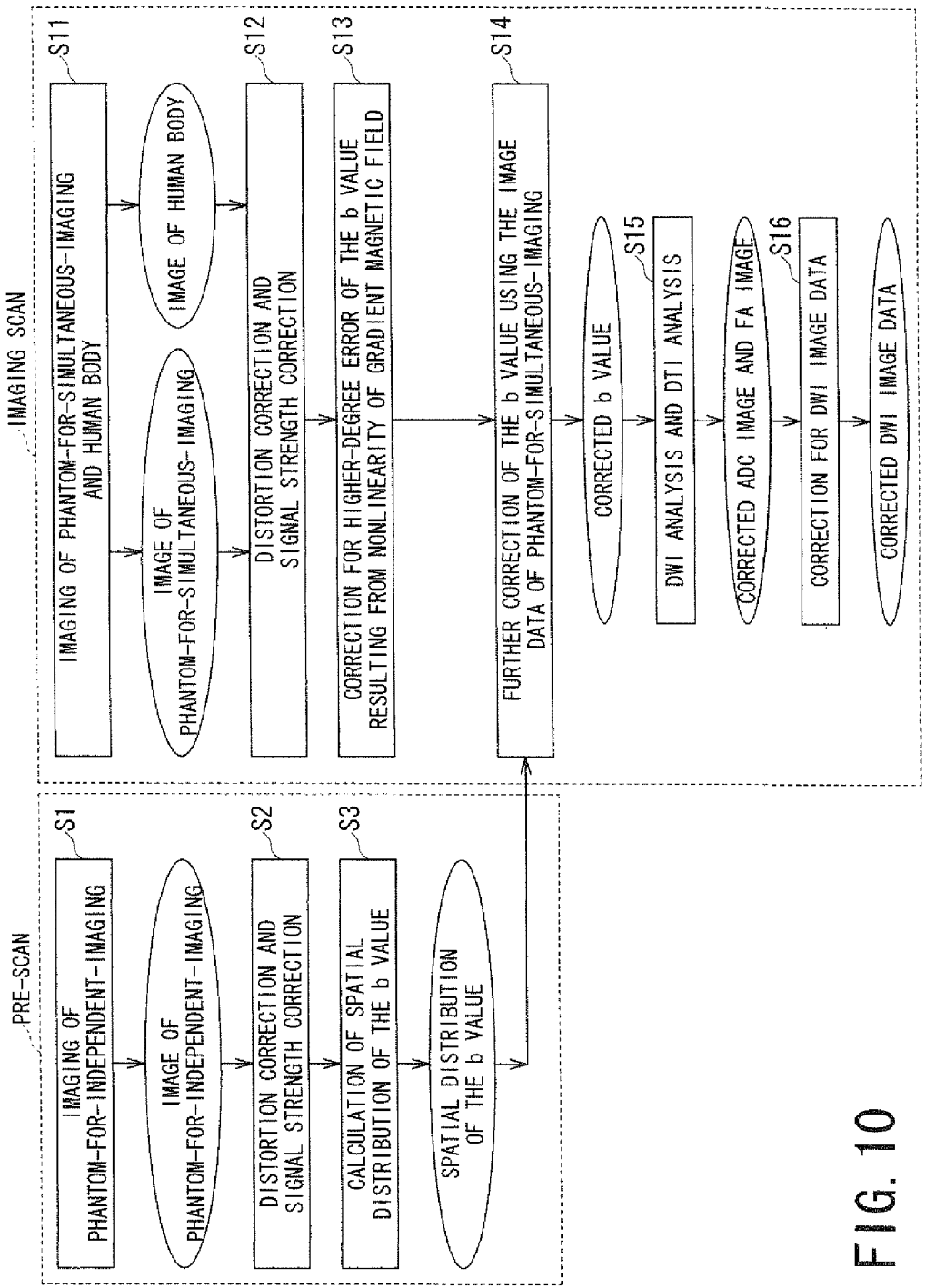
FIG. 10 is a flow chart which shows the process in which the magnetic resonance imaging apparatus shown in FIG. 1 performs DWI, and measures the ADC value of a human body with high precision while correcting the distortion in a DWI image and the b value.

FIG. 10 is a flow chart which shows the process in which the magnetic resonance imaging apparatus 20 performs DWI, and measures the ADC value of a human body with high precision while correcting the distortion in a DWI image and correcting the b value.

Mostly, when correcting the b value to increase the accuracy of measurement of the ADC value, imaging of the phantom-for-independent-imaging is performed first by the pre-scanning, and then the spatial distribution of the b value is measured based on the acquired image of the phantom-for-independent-imaging.

The b value is preset to the magnetic resonance imaging apparatus 20 and it can be changed in the predetermined range. The value of about 1000 [s/mm$^2$] is often used as a typical b value for a human body.

Therefore, when imaging the phantom-for-independent-imaging and measuring the spatial distribution of the b value as correction data, the preset b value is set to the same value, for example, 1000 [s/mm2], as the value when measuring the ADC value of the human body.

Next, imaging of a human body is performed by the imaging scan with a phantom-for-simultaneous-imaging, and the corrected ADC value and the corrected image of DWI of the human body are obtained, using the measured b value based on the image of the phantom-for-independent-imaging image and/or the image of the phantom-for-simultaneous-imaging.

It is also possible to obtain the corrected ADC value and the image of DWI from a human body image only using the spatial distribution of the b value generated from the image of the phantom-for-independent-imaging, without imaging a phantom-for-simultaneous-imaging.

Vice versa, it is also possible to obtain the corrected ADC value and the image of DWI from the human body image only using the measured b value based on the image of the phantom-for-simultaneous-imaging, without imaging a phantom-for-independent-imaging.

In Step S1 of a pre-scan in FIG. 10, imaging of a phantom-for-independent-imaging is performed by using the RF coil as a receiving RF coil 24A to which the phantom-for-independent-imaging is fixed. Imaging of the phantom-for-independent-imaging can not omitted if the phantom-for-simultaneous-imaging is not imaged.

When the b value has a spatial error distribution with second or higher degree, even if the phantom-for-simultaneous-imaging is imaged, it is desirable to image a phantom-for-independent-imaging from a viewpoint of the improvement in correction accuracy.

For imaging the phantom-for-independent-imaging, the receiving RF coil 24A, to which the phantom-for-independent-imaging as an object P is fixed beforehand, is set to bed 37.

Then, the static-magnetic-field magnet 21 (superconducting magnet) magnetized by the static magnetic field power supply 26 forms a static magnetic field in the imaging region of the phantom-for-independent-imaging. The static magnetic field is equalized by supplying current to the shim coil 22 from the shim coil power supply 28.

Meanwhile, the imaging condition setting unit 40 sets the imaging conditions for pre-scans including the non-DWI sequence with b=0, and the DWI sequence with b>0. Then, when a scan start instruction is given to the sequence controller control unit 41 from input unit 33, the sequence controller control unit 41 sends the imaging conditions acquired from the imaging condition setting unit 40 to the sequence controller 31.

The sequence controller 31 drives the gradient magnetic field power supply 27, transmitter 29, and receiver 30 according to the imaging condition received from the sequence controller control unit 41 to form a gradient magnetic field in the imaging region where the phantom-for-independent-imaging is set. Then, the sequence controller 31 instructs the RF coil 24A to emit an RF signal.

With this RF signal, the nuclear magnetic resonance inside the phantom-for-independent-imaging occurs, and an NMR signal is generated. The NMR signal is received by the receiving RF coil 24A, and is sent to the receiver 30. The receiver 30 generates raw data, which are digitalized NMR signal, by carrying out an A/D conversion after performing necessary signal processing to the NMR signal. The receiver 30 sends the generated raw data to the sequence controller 31.

The sequence controller 31 further sends the raw data to the sequence controller control unit 41, and the sequence controller control unit 41 arranges the raw data into the k-space formed in the data processing unit 42 as k-space data.

The data processing unit 42 performs image reconstruction processing to the k-space data, and generates an image data of the phantom-for-independent-imaging as DWI data in the real space.

This image data of the phantom-for-independent-imaging usually has distortion because of an error of a gradient magnetic field, or an influence of an eddy current.

Thus, in Step S2 in FIG. 10, the data processing unit 42 performs shape distortion correction processing to the image data of the phantom-for-independent-imaging and signal strength correction processing accompanying the shape distortion of the phantom-for-independent-imaging image data.

First, the shape distortion correction processing will be explained.

The amount of correction for the distortion resulting from the nonlinearity of the gradient magnetic fields other than distortion resulting from eddy current is usually known. Thus, the image data of the phantom-for-independent-imaging is first corrected using the known amount of corrections. As a result, the distortion component resulting from the nonlinearity the gradient magnetic field is corrected.

Next, the phantom-for-independent-imaging image data acquired with b>0 is corrected, on the basis of the phantom-for-independent-imaging image data acquired with b=0, so that the difference of the center-of-gravity position between both image data becomes zero.

In other words, the form distortion of the phantom-for-independent-imaging image data acquired with b>0 is corrected so that the center-of-gravity position of the image data with b=0 coincides with the center-of-gravity position of the image data with b>0. With this correction, the distortion component of the eddy current origin can be corrected.

More specific correction procedure for correcting the distortion component of the eddy current origin will be explained below.

First, the signal measuring positions of n points before the distortion correction on the phantom-for-independent-imaging image acquired for b>0 are set to be (x1', y1', z1'), (x2', y2', z2'), (x3', y3', z3'), - - - , and (xn', yn', zn').

Then, an affine transformation matrix which transforms the corresponding signal measuring positions on the phantom-for-independent-imaging image data for b=0 to the signal measuring positions on the phantom-for-independent-imaging image data for b>0 is obtained.

Thereafter, the phantom-for-independent-imaging image data for b>0 is transformed by the affine inverse transformation.

In the corresponding voxels on plural image of DWIs acquired by common conditions, the amount of correction by the affine inverse transformation becomes the same.

With the distortion correction of phantom-for-independent-imaging image data $Sp(x', y', z')$ in the position $(x', y', z')$ before distortion correction, the phantom-for-independent-imaging image data $S_{D_{cor}}(x, y, z)$ in the position $(x', y', z')$ after distortion correction is calculated.

If movement of the positions due to the distortion of the image is assumed to occur only in a slice plane two-dimensionally, the movement amount in Z axial direction will be zero. In this case, the affine transform from $(x', y')^t$ to $(x, y)$ is expressed in the following equation (1). Here, t indicates transposition.

$$\begin{pmatrix} x' \\ y' \end{pmatrix} = T \begin{pmatrix} x \\ y \\ 1 \end{pmatrix} \qquad (1)$$

$$T = \begin{pmatrix} a_1 b_1 c_1 \\ a_2 b_2 c_2 \end{pmatrix}$$

The equation (1) shows that each coefficient in the matrix T is computable by solving the equation, if the number n of the signal measuring position on phantom-for-independent-imaging image data is at least six, n=6. The coordinate on the distorted phantom-for-independent-imaging image data can be corrected to the coordinate after a correction, by carrying out linear transform using the computed matrix.

Fort the case that the parallel movement of the position by distortion can be disregarded, c1 and c2 are set to c1=0 and c2=0. In this case, four signal measuring positions on the phantom-for-independent-imaging image data are sufficient to obtain the matrix T.

In many cases, the data collection in the EPI sequence used for DWI is two-dimensional (2D). In this case, two-dimensional (2D) distortion correction will be enough.

On the other hand, when carrying out three-dimensional (3D) affine transform, the number of elements in the matrix T will be 4×3=12 elements, and therefore at least twelve (12) signal measuring positions on the phantom-for-independent-imaging image data are required for this case.

As mentioned above, the phantom-for-independent-imaging is formed in a pillar shape so that the longitudinal direction thereof corresponds to the Z axial direction. Therefore, when carrying out three-dimensional affine transform, it is sufficient to acquire the phantom-for-independent-imaging image data in at least three slices, the positions of which are different in the Z axial direction.

When there are more signal measuring positions than the number of the elements to be determined in the matrix T, the inverse matrix can also be solved by singular value decomposition (SVD).

After distortion correction processing, correction processing of signal strength is performed. That is, signal strength $S_{DI_{cor}}(x, y, z)$ of the phantom-for-independent-imaging image data after a signal strength correction is calculated by correcting signal strength $S_{D_{cor}}(x, y, z)$ of the phantom-for-independent-imaging image data after a shape distortion correction by using the following equation (2).

$$S_{DIcor}(x, y, z) = J * S_{Dcor}(x, y, z) \tag{2}$$
$$\approx [V(x', y', z')/V_{Dcor}(x, y, z)] * S_{Dcor}(x, y, z)$$

Here, in equation (2), V (x, y, z) indicates a volume of voxel at a position (x, y, z), "J" indicates Jacobian, and subscript "Dcor" indicates the data after shape distortion correction.

The shape distortion correction processing and the signal strength correction processing are performed to both the phantom-for-independent-imaging image data for b=0, and the phantom-for-independent-imaging image data for b>0.

Then, in Step S3, the data correcting unit 43 acquires the phantom-for-independent-imaging image data after shape distortion correction and signal strength correction from the data processing unit 42 and calculates the spatial distribution of the b value.

In general, an error distribution of a gradient magnetic field exhibits second or higher degree of spatial distribution, and therefore the actually realized b value is influenced by the error distribution of the gradient magnetic field.

Therefore, it is necessary to obtain the spatial distribution of the b value including the b value of the central part of an imaging region, and to correct physical quantity, such as the measured ADC value by the imaging scan for a human body, by using the obtained spatial distribution of the b value.

In this respect, the phantom-for-independent-imaging has a size which covers the whole FOV, and the ADC value thereof is known. Therefore, the spatial distribution of the b value can be measured from the phantom-for-independent-imaging image data after distortion correction and a signal strength correction.

More specifically, there exists relation, as shown in equation (3), among the following parameters: signal strength of the image data of phantom-for-independent-imaging PA corresponding to b=0, and b>0 after distortion correction and a signal strength correction, $S_{PA.DIcor}(x, y, z, b=0)$, and $S_{PA.DIcor}(x, y, z, b>0)$, respectively; an ideal b value, $b_{ideal}$, from the control viewpoint, (namely, a preset value of b value); an actually generated b value, $b_{measuredA}(x, y, z)$, (namely, an actually realized b value); a known ADC value for the phantom-for-independent-imaging PA, $ADC_{PA.ideal}$; and an actually obtained ADC value for the phantom-for-independent-imaging PA, $ADC_{PA.measured}(x, y, z)$.

$$\ln [S_{PA.DIcor}(x,y,z,b=0)/S_{PA.DIcor}(x,y,z,b>0)] = b_{measuredA}(x,y,z)$$
$$*ADC_{PA.ideal} = b_{ideal}*ADC_{PA.measured}(x,y,z) \tag{3}$$

Referring to equation (3), spatial distribution of the b value, $b_{measuredA}(x, y, z)$, can be calculated from the following equation (4).

$$b_{measuredA}(x,y,z) = \ln [S_{PA.DIcor}(x,y,z,b=0)/S_{PA.DIcor}(x,y,z,b>0)]/ADC_{PA.ideal} \tag{4}$$

Figure 11:
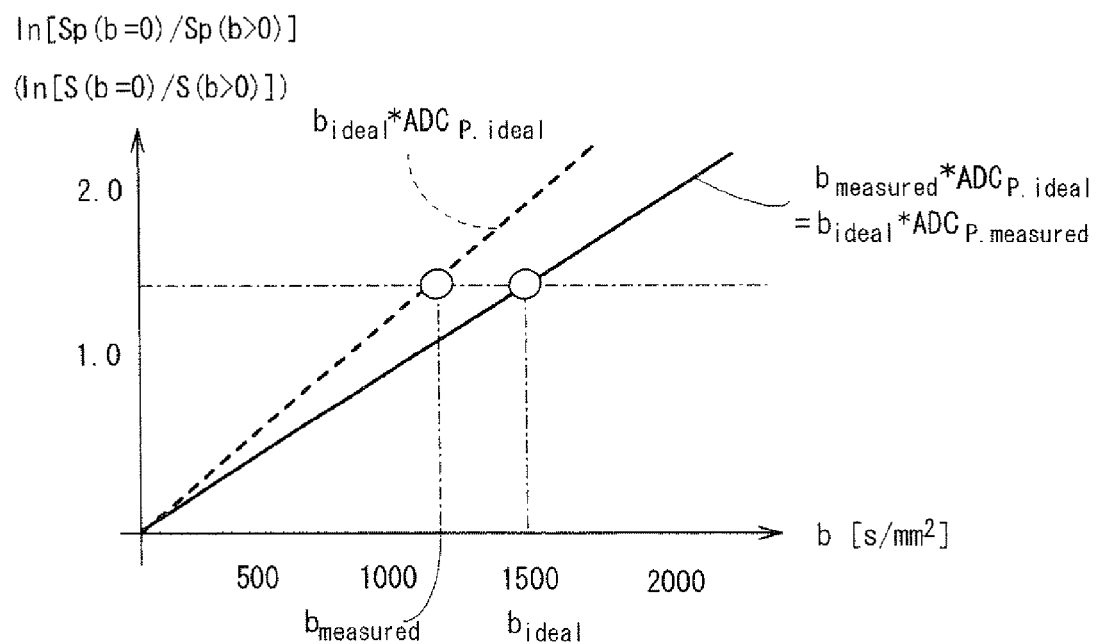
FIG. 11 shows a graph which indicates a realized b value $b_{measured}$ and a preset b value $b_{ideal}$ in a certain position.

In FIG. 11, the graph shows the relation of the preset b value, $b_{ideal}$, in a certain position, and the actually realized b value, $b_{measuredA}$. In FIG. 11, the horizontal axis shows the b value [s/mm$^2$], and the vertical axis shows the quantity, ln {Sp (b=0)/Sp (b>0)}, obtained from signal strengths Sp (b>0) and Sp (b=0) of the image data of phantom P, corresponding to b=0 and b>0, respectively. The dotted line in FIG. 11 indicates the value of ln {S (b=0)/S (b>0)} which is calculated from the preset b value, $b_{ideal}$, and an ideal ADC value (known ADC value), $ADC_{PA.ideal}$, of the phantom P.

A solid line shows the value of ln {S (b=0)/S (b>0)} calculated from the realized b value, $b_{measuredA}$ and an ideal ADC value (known ADC value), $ADC_{PA.ideal}$, of the phantom P. As shown in FIG. 11, since the actually realized b value does not coincide with the preset b value, $b_{ideal}$, the value of in {S (b=0)/S (b>0)} is shifted.

On the basis of the relation of the equation (3), the realized b value, $b_{measuredA}$ can be calculated from the equation (4). In other words, by using the equation (4), the preset b value, $b_{ideal}$ can be corrected to the realized b value, $b_{measuredA}$.

When the number of applying directions of a MPG pulse is large, such as in the case of performing DTI, exactly speaking, it is necessary to measure the spatial distribution of the b value, $b_{measuredA}(x, y, z)$, the same number of times as the number of the applying directions of a MPG pulse.

However, there is a possibility that the quantity of measurement data may become huge in this case. Thus, for data size reduction, the spatial distribution of the b value, $b_{measuredA}(x, y, z)$, may be measured only to one of the axis of the X-axis, a Y-axis and the Z-axis. Then, on the assumption that there is neither interaction, nor difference in the b value among the X-axis, Y-axis, and Z-axis, and linearity exist, the spatial distribution of the b value, $b_{measuredA}$ (x, y, z) in each remaining axis direction of the MPG pulse application may be obtained by calculation.

In the case of the PC (phase contrast) method, since the applying directions of the MPG pulse is determined of each positive direction component and each negative direction component of X, Y, and Z axial direction, the number of the applying directions of the MPG pulse leads to six.

The MPG pulse may be applied in the direction other than X, Y, and Z axial direction. For example, in the PC (phase contrast) method, the MPG pulse may be applied in the traveling direction of the blood vessel corresponding to VENC (velocity encoding).

In the case that the difference between the spatial distribution of the b value $b_{measuredA}(x, y, z)$ of the phantom-for-independent-imaging PA and the spatial distribution of the b value of the human body can be considered negligibly small, the spatial distribution of the b value, $b_{measuredA}(x, y, z)$ of the phantom-for-independent-imaging PA can be used directly for calculation of the physical quantity, such as ADC value. In this case, it is not necessary to perform imaging of the phantom-for-simultaneous-imaging.

By contrast, when the difference of the spatial distribution of the b value, $b_{measuredA}(x, y, z)$ of phantom-for-independent-imaging PA and the spatial distribution of the b value of a human body cannot be considered negligibly small, it is desirable, from a viewpoint of correction accuracy, to image a phantom-for-simultaneous-imaging in an imaging scan.

For example, when the lapsed time between the imaging time of the phantom-for-independent-imaging PA and the imaging time of a human body is large, or when each imaging environment (temperature etc.) differs, it is desirable to image a phantom-for-simultaneous-imaging in an imaging scan. In this case, the spatial distribution of the b value $b_{measuredA}(x, y, z)$ of the phantom-for-independent-imaging PA is corrected by the low degree correction, such as linear correction, so that each b value of the phantom-for-independent-imaging PA and the phantom-for-simultaneous-imaging coincides at the same position.

The phantom-for-simultaneous-imaging does not necessarily need to be imaged simultaneously with a human body. The phantom-for-simultaneous-imaging may just be imaged at least once, within a period in which the spatial distribution of the b value at the time of imaging of a human body is regarded as not being changed.

More specifically, in Step S11 of the imaging scan in FIG. 10, imaging of a human body is performed with a phantom-for-simultaneous-imaging. That is, following the sequence flow similar to imaging of the phantom-for-independent-imaging, an image data of the phantom-for-simultaneous-imaging and an image data of the human body are acquired, using a RF coil as receiving RE coil 24A in which a phantom-for-simultaneous-imaging is provided, as shown in FIG. 4-FIG. 8.

Before scanning for data acquiring, scanning for positioning is performed Then, referring to the positioning image acquired with the positioning scanning, the size of FOV is set so that the phantom-for-simultaneous-imaging may be included in an imaging region.

Thereafter, in scanning for data acquisition, the MPG pulse corresponding to the preset b value is applied in predetermined each axial direction to acquire data.

The b value is preset to two values, for example, b=0 and b=1000, which are usually used in DWI for a human body. Depending on the purpose of imaging, or when nonlinearity in the b value is predicted, three or more of the b values may be preset in each axial direction.

Since the phantom-for-simultaneous-imaging is fixed to the predetermined position inside the receiving RF coil 24A, there is no necessity for changing the set FOV for every data acquisition, and the position reproducibility of a phantom-for-simultaneous-imaging also becomes high. As a result, high-level image processing for recognition of the position of the phantom-for-simultaneous-imaging on image data is not needed.

Figure 12:
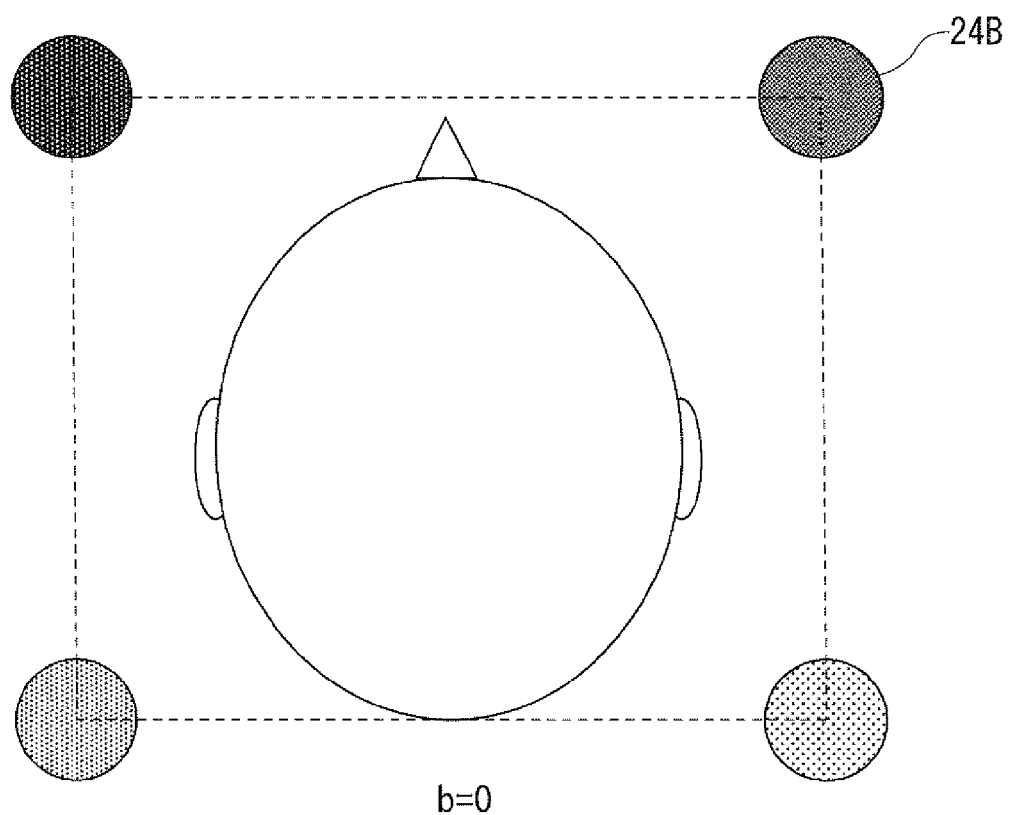
FIG. 12 is a figure showing an example of an image data of a phantom-for-simultaneous-imaging and an image data of a human body obtained by performing non-DWI while setting the b value as b=0.

FIG. 12 is a figure showing an example of an image data of a phantom-for-simultaneous-imaging and an image data of a human body obtained by performing non-DWI, where the b value is preset to b=0.

Figure 13:
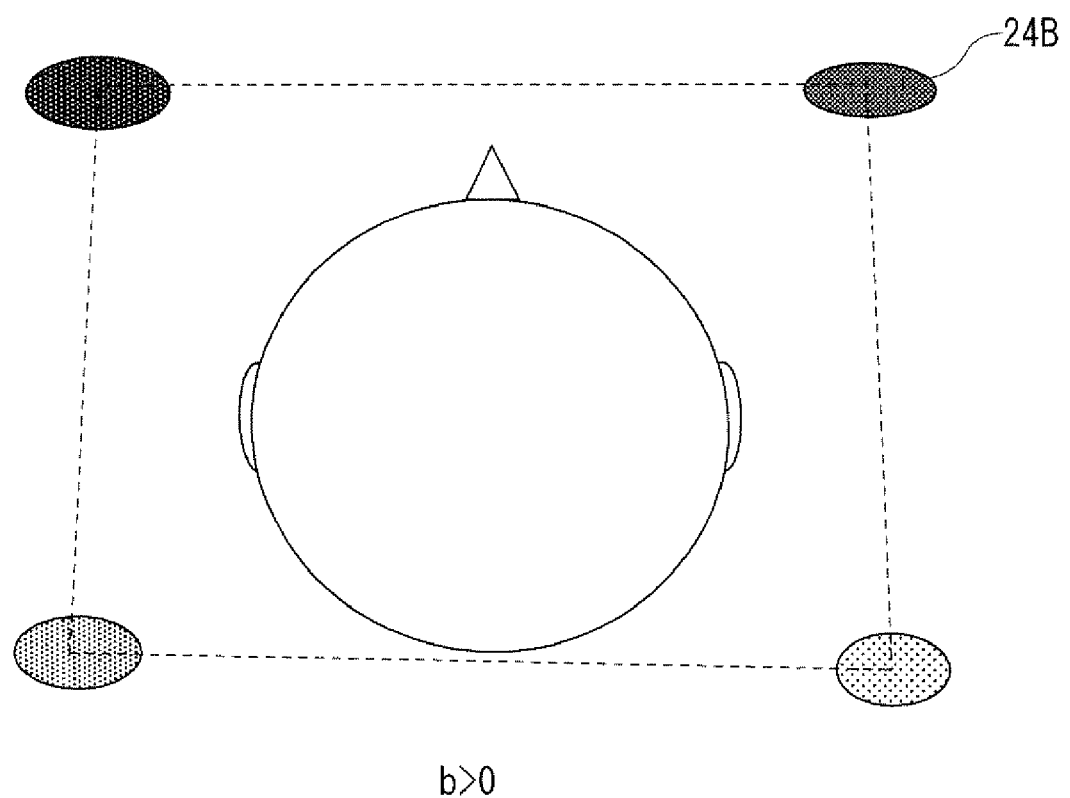
FIG. 13 is a figure showing an example of an image data of a phantom-for-simultaneous-imaging and an image data of a human body obtained by performing DWI, while setting the b value as b>0.

On the other hand, FIG. 13 is a figure showing an example of an image data of a phantom-for-simultaneous-imaging and an image data of a human body obtained by performing DWI, where the b value is preset to b>0.

In the case of b=0, since a MPG pulse is not applied, the error of a gradient magnetic field and the influence of an eddy current are small. Thus, as shown in FIG. 12, the shape distortion in the image of the phantom-for-simultaneous-imaging and the human body corresponding to b=0 is negligibly small.

On the other hand, in the case of b>0, a MPG pulse with large strength is applied. As a result, as shown in FIG. 13, in the image of the phantom-for-simultaneous-imaging and the human body corresponding to b>0, the shape distortion which cannot be disregarded arises due to the error of a gradient magnetic field, or the influence of an eddy current.

Then, in Step S12, in a manner similar to Step S2, data processing unit 42 performs the shape distortion correction processing and the signal strength correction processing to the image data of the phantom-for-simultaneous-imaging and the human body.

Thereafter, from the signal value of the image data of the human body and the b value after distortion correction and a signal strength correction, physical quantity, such as the ADC value and the FA value can be obtained.

There exists, however, an error in the b value due to the influence of the nonlinearity of a gradient magnetic field. Then, in Step S13, correction processing for a higher-degree error of the b value resulting from the nonlinearity of the gradient magnetic field is performed in the data processing unit 42.

The b value is proportional to the square of the strength of a gradient magnetic field.

Therefore, an actual b value, i.e., a corrected b value $b_{cor}(x, y, z)$ is obtained by substituting ideal b values from the control viewpoint, i.e., the preset b values, $b_{x.ideal}$, $b_{y.ideal}$, and $b_{z.ideal}$ for respective X-axis, Y-axis, and Z-axis, and error distributions of the gradient magnetic field, $G_x$error.ratio(x, y, z), $G_y$error.ratio(x, y, z) and $G_z$error.ratio(x, y, z) for respective X-axis, Y-axis, and Z-axis into equation (5).

$$b_{cor}(x, y, z) = G_x\text{error} \cdot \text{ratio}(x, y, z)^2 * b_{x \cdot ideal} + \\ G_y\text{error} \cdot \text{ratio}(x, y, z)^2 * b_{y \cdot ideal} + G_z\text{error} \cdot \text{ratio}(x, y, z)^2 * b_{z \cdot ideal} \quad (5)$$

In equation (5), error distribution of a gradient magnetic field $G_x$error.ratio(x, y, z), $G_y$error.ratio(x, y, z), and $G_z$error.ratio(x, y, z are the ratios of the strength of the actual gradient magnetic field to the strength of the ideal gradient magnetic field from the control viewpoint in the X-axis, Y-axis, and Z axis direction, respectively.

As shown in equation (5), the b value $b_{cor}$ after a correction is a function of x, y, and z.

It can be considered that the second or higher degree of the spatial distribution of the b value due to the influence of the nonlinearity of the gradient magnetic field is mostly corrected by the correction processing using equation (5).

However, the linear error according to conditions, such as property of individual equipment, types of the model, and imaging time, may exist in the b value boor after correction. Thus, in Step S14, the linear error of the b value boor in which spatial distribution is corrected is further corrected based on the image data of the phantom-for-simultaneous-imaging.

For this purpose, the data correcting unit 43 acquires, from the data processing unit 42, signal strength $S_{PB.DIcor}(b=0)$ and S $S_{PB.DIcor}(b>0)$ of the image data of the phantom-for-simultaneous-imaging after the signal strength correction, each corresponding to b=0 and b>0. Then, as shown in equation (6), the data correcting unit 43 calculates average values of $S_{PB.DIcor}(b=0)$ and S $S_{PB.DIcor}(b>0)$ of the phantom-for-simultaneous-imaging after signal strength correction. The data correcting unit 43 further calculates corrected b value $b_{measuredB}$, which does not have spatial distribution, from the average values and the known ADC value, $ADC_{PB.ideal}$, of the phantom-for-simultaneous-imaging.

$$b_{measuredB} = \ln\left[\text{mean}\{S_{PB.DIcor}(b=0)\}/\text{mean}\{S_{PB.DIcor}(b>0)\}\right]/ADC_{PB.ideal} \quad (6)$$

In equation (6), mean (S) indicates a function which calculates the average value of signal strength S.

Instead of performing higher-order-correction of the b value based on the error distribution of the gradient magnetic field in Step S13, second or higher degree of the spatial distribution of the b value can also be obtained, in Step S14, based on the spatial distribution $b_{measuredA}(x, y, z)$ of the b value using the phantom-for-independent-imaging and/or the image data of the phantom-for-simultaneous-imaging. In this case, the processing in Step S13 can be omitted.

On the other hand, when the b value without spatial distribution is obtained by performing processing in Step S13, or when the b value is, in the first place, constant, imaging of the phantom-for-independent-imaging and calculation of the spatial distribution $b_{measuredA}$(x, y, z) of the b value can be omitted.

In contrast, when the b value has spatial distribution, it is necessary to obtain the spatial distribution of the b value comprehensively.

As mentioned above, when the spatial distribution $b_{measuredA}$(x, y, z) of the b value calculated using the phantom-for-independent-imaging can be considered to coincide with the spatial distribution of the b value of a human body, the spatial distribution $b_{measuredA}$(x, y, z) of the b value obtained using the phantom-for-independent-imaging can be used without further correction.

In contrast, when the spatial distribution $b_{measuredA}$(x, y, z) of the b value calculated using the phantom-for-independent-imaging cannot be considered to coincide with the spatial distribution of the b value of a human body, the spatial distribution of the b value can be calculated as shown below.

First, in the region in which the phantom-for-simultaneous-imaging exists, the spatial distribution of the b value is calculated from an equation (7).

$$b_{measuredB}(x,y,z) = \ln[S_{PB.DIcor}(x,y,z,b=0)/S_{PB.DIcor}(x,y,z,b>0)]/ADC_{PB.ideal} \quad (7)$$

On the other hand, the spatial distribution of the b value for the region in which the phantom-for-simultaneous-imaging does not exist can be calculated by an approximation using a model function or an interpolation.

Next, the spatial distribution $b_{measuredA}$(x, y, z) of the b value obtained using the phantom-for-independent-imaging is corrected based on the spatial distribution $b_{measuredB}$(x, y, z) of the b value using the phantom-for-simultaneous-imaging. In the case that material of the phantom-for-independent-imaging and the phantom-for-simultaneous-imaging is the same, and the difference of the image data between the phantom-for-independent-imaging and the phantom-for-simultaneous-imaging is negligibly small, the ADC value ADC-PA.measured (x, y, z) and the ADC value ADCPB.measured (x, y, z) at the same position should be the same.

Then, the data correcting unit 43 corrects the spatial distribution $b_{measuredA}$(x, y, z) of the b value obtained using the phantom-for-independent-imaging so that the ADC value $ADC_{PA.measured}$(x, y, z) of the phantom-for-independent-imaging and ADC value $ADC_{PB.measured}$(x, y, z) of the phantom-for-simultaneous-imaging at the same position coincides with each other.

Namely, when the correction processing of the spatial distribution $b_{measuredA}$(x, y, z) of the b value obtained using the phantom-for-independent-imaging is expressed as bCor[ ], the spatial distribution $b_{measured}$(x, y, z) of the b value after the correction for which it does not depend on whether it is a phantom-for-independent-imaging or it is a phantom-for-simultaneous-imaging is obtained by equation (8).

$$b_{measured}(x,y,z) = bCor\{b_{measuredA}(x,y,z), b_{measuredB}(x,y,z)\} \quad (8)$$

As mentioned above, the spatial distribution model of the b value for obtaining the spatial distribution $b_{measured}$(x, y, z) of the b value after a correction may be either a spatial-distribution for the phantom-for-independent-imaging or a spatial distribution for the phantom-for-simultaneous-imaging, not the combination of the $b_{measuredA}$(x, y, z) and the $b_{measuredB}$(x, y, z). It can be experientially determined which distribution is used in order to obtain the spatial distribution $b_{measured}$(x, y, z) of b value after a correction, according to conditions, such as existence of processing in Step S13, or properties of the equipment.

For example, as mentioned above, when the second or higher degree of spatial distribution of the b value can be disregarded, the spatial distribution $b_{measured}$(x, y, z) after a correction can be obtained without using the spatial distribution $b_{measuredA}$(x, y, z) of the phantom-for-independent-imaging.

Data correcting unit 43 sends the spatial distribution $b_{measured}$(x, y, z) after correction to the data processing unit 42.

Next, in Step S15, data processing unit 42 conducts DWI analysis and/or DTI analysis.

As shown in equation (9), a corrected ADC image data $ADC_{cor}$(x, y, z) is generated using the spatial distribution $b_{measured}$(x, y, z) after correction, the image data $S_{DIcor}$(x, y, z, b=0), and $S_{DIcor}$(x, y, z, b>0) after distortion and signal strength correction.

$$ADC_{cor}(x,y,z) = \ln\{S_{DIcor}(x,y,z,b=0)/S_{DIcor}(x,y,z,b>0)\}/b_{measured}(x,y,z) \quad (9)$$

The measured value of the ADC value may have nonlinearity to a theoretical value. In this case, it is desirable to transform the ADC image data $ADC_{cor}$(x, y, z) using correction function CorADC[ ] for correcting the influence of the nonlinearity of the ADC value, as shown in equation (10).

$$ADC_{cor}(x,y,z) = CorADC[ADC_{cor}(x,y,z)] \quad (10)$$

The influence of the nonlinearity of the ADC value of each voxel of the ADC-image-data $ADC_{cor}$(x, y, z) can be corrected by equation (10).

A quadratic function may be sufficient for the correction function CorADC. Therefore, the correction function CorADC can obtained by determining coefficients A and B of equation (11) from known plural ADC value $ADC_{P.ideal}$ of a phantom, and plural ADC value $ADC_{P.measured}$ actually measured from phantom image data.

$$ADC_{P.measured} = CorADC[ADC_{P.ideal}]$$
$$= A * ADC_{P.ideal}^2 + B * ADC_{P.ideal} \quad (11)$$

Here, A and B are coefficients of the quadratic function.

On the other hand, corrected image of FA data $FA_{cor}$(x, y, z) can be obtained from the corrected ADC-image-data $ADC_{cor}$(x, y, z) using equation (12).

$$FA_{cor}(x,y,z) = sqrt(1.5)*sqrt[\{\lambda_1(x,y,z)-D_m(x,y,z)\}^2 + \{\lambda_2(x,y,z)-D_m(x,y,z)\}^2\{\lambda_3(x,y,z)-D_m(x,y,z)\}^2]/sqrt\{\lambda_1(x,y,z)^2+\lambda_2(x,y,z)^2+\lambda_3(x,y,z)^2\} \quad (12)$$

Here, $$D_m = \text{trace } ADC_{cor}(x,y,z)/3 = \{\lambda_1(x,y,z)+\lambda_2(x,y,z)+\lambda_3(x,y,z)\}/3, \text{ and}$$

$\lambda_1, \lambda_2, \lambda_3 (\lambda_1 > \lambda_2 > \lambda_3)$ are the diagonal components after orthogonalization of the diffusion tensor matrix of 3×3 after correction.

If necessary, in Step S16, DWI data can be corrected using ADC-image-data $ADC_{cor}$(x, y, z) after a correction, and human body image data $S_{DIcor}$(x, y, z, b=0) after distortion correction and signal strength correction for b=0. In this case, in the data processing unit 42, human body image data $S_{DIBcor}$(x, y, z, b>0) after correction for b>0 is calculated by using equation (13).

$$S_{DIBcor}(x,y,z,b>0) = S_{DIcor}(x,y,z,b=0)*\exp\{-b_{measured}(x,y,z)*ADC_{cor}(x,y,z)\} \quad (13)$$

Isotropic image of Owl data is often generated as image of DWI data for b>0. In this case, $ADC_{cor}(x, y, z)$ in equation (13) may be substituted with trace $ADC_{cor}(x, y, z)$. The corrected image data $ADC_{cor}(x, y, z)$, the corrected FA image data $FA_{cor}(x, y, z)$, and the corrected DWI image data $S_{DIBcor}(x, y, z, b>0)$, generated in the manner as mentioned above, are outputted to the display 34 from the data processing unit 42.

The corrected image data $ADC_{cor}(x, y, z)$, the corrected FA image data $FA_{cor}(x, y, z)$, and the corrected DWI image data $S_{DIBcor}(x, y, z, b>0)$ displayed on the display unit 34 are obtained by using the actually realized b value which is calculated on the basis of the image data of the phantom-for-independent-imaging and/or the phantom-for-simultaneous-imaging of which the ADC value are known, and therefore resulting in being highly accurate.

In the above mentioned method for increasing the measurement accuracy of the ADC value, the FA value, and the DWI image, the corrected spatial distribution of the b value in the whole FOV after a shape distortion correction is obtained as correction data, by calculating the difference between the known ADC value and the measured ADC of the phantom, from the image data of the phantom obtained in independent imaging and/or simultaneous imaging with a human body, and by using the correction function of the b value obtained form the calculated difference.

By using the corrected spatial distribution of b value, the DWI image data, and the ADC value and the FA value which are the quantitative parameters in DWI analysis or DTI analysis can be calculated with high accuracy.

This procedure, i.e., the procedure in which the corrected spatial distribution of b value, can expect reduction of throughput compared with a below mentioned procedure for increasing the accuracy of measurement by correcting the ADC value.

For example, when the second or higher degree of spatial distribution of the b value may exist, the spatial distribution of the b value in the whole FOV can be measured comprehensively, based on the phantom image data obtained by imaging the phantom-for-independent-imaging. Then, zeroth or first degree correction, based on the image data of the phantom-for-simultaneous-imaging partially imaged with the human body, is performed to the spatial distribution of the b value measured by imaging of the phantom-for-independent-imaging.

On the other hand, if the second or higher degree spatial distribution of the b value can be disregarded in the central part of FOV, in which a phantom cannot be disposed when imaging of a human body, the b value in the whole FOV can be calculated by imaging only the phantom-for-simultaneous-imaging. Therefore, in this case, it is sufficient to image the phantom-for-simultaneous-imaging with a human body without imaging the phantom-for-independent-imaging.

Next, the case will be explained where the accuracy of measurement of quantitative values, such as ADC value, and an image of DWI is increased by correcting ADC value.

Figure 14:
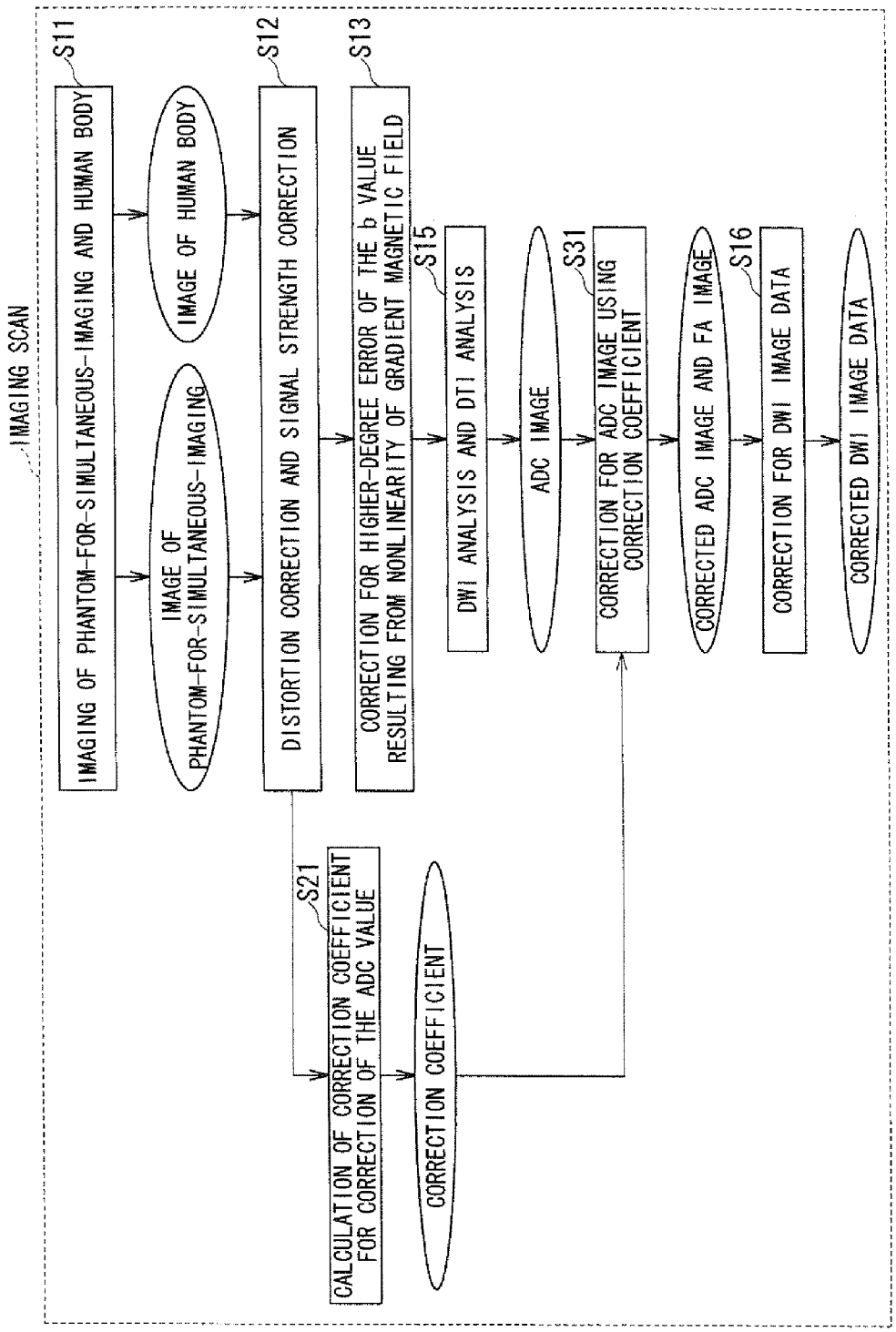
FIG. 14 is a flow chart which shows a process in which the magnetic resonance imaging apparatus shown in FIG. 1 performs DWI, and measures the ADC value of a human body with high precision, while correcting the distortion in a DWI image and the ADC value.

FIG. 14 is a flow chart which shows the process in which the magnetic resonance imaging apparatus 20 shown in FIG. 1 performs DWI, and measures the ADC value of a human body with high precision while correcting the distortion in a DWI image and the ADC value. The same reference numeral is attached to the same step as FIG. 10, and explanation is omitted.

In Step S21 of FIG. 14, the data correcting unit 43 calculates the correction coefficient for correction of the ADC value by acquiring the image data of the phantom-for-simultaneous-imaging after distortion correction and a signal strength correction from the data processing unit 42.

The correction processing is a scaling processing if the correction processing is a first degree processing. On the other hand, if the correction processing is a second or higher degree processing, the correction processing is a scaling processing or a correction processing using a correction function.

In the signal strength of the image data of the phantom-for-simultaneous-imaging, relation defined in equation (14) similar to the above-mentioned equation (3) exists.

$$\ln [S_{PB.DIcor}(x,y,z,b=0)/S_{PB.DIcor}(x,y,z,b>0)] = b_{measuredB}(x,y,z) * ADC_{PB.ideal} = b_{ideal} * ADC_{PB.measured}(x,y,z) \quad (14)$$

Measured ADC value of the phantom-for-simultaneous-imaging $ADC_{PB.measured}(x, y, z)$ is obtained by the relation of equation (14) and equation (15).

$$ADC_{PB.measured}(x,y,z) = \ln \{S_{PB.DIcor}(x,y,z,b=0)/S_{PB.DIcor}(x,y,z,b>0)\}/b_{ideal} \quad (15)$$

Next, scaling factor Kcor or plural correction coefficients of the ADC value are estimated from the ratio of measured value $ADC_{PB.measured}(x, y, z)$ and the theoretical-value $ADC_{PB.ideal}$ of the ADC value of the phantom-for-simultaneous-imaging.

Figure 15:
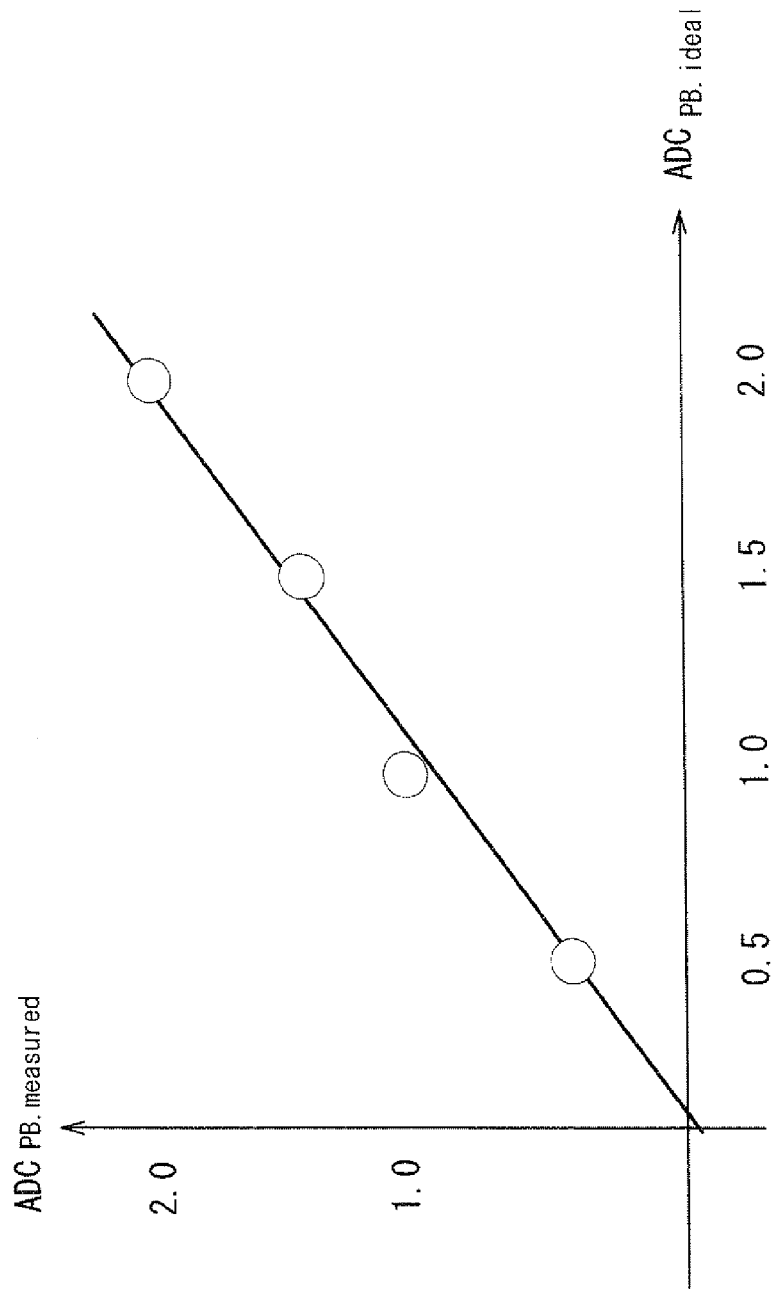
FIG. 15 is a figure showing an example, in which the theoretical ADC value and measured ADC value of a phantom-for-simultaneous-imaging show linear relation.

FIG. 15 is a figure showing an example in the case that the theoretical ADC value and measured ADC value of a phantom-for-simultaneous-imaging show linear relation. In FIG. 15, the horizontal axis shows theoretical-value $ADC_{PB.ideal}$ of the ADC value of a phantom-for-simultaneous-imaging. The vertical axis shows measured value ADCPB.measured of the ADC value of the phantom-for-simultaneous-imaging in a certain position.

When the relation between the measured value $ADC_{PB.measured}(x, y, z)$ and the theoretical-value $ADC_{PB.ideal}$ of the ADC value of a phantom-for-simultaneous-imaging is linear, plot data as shown in FIG. 15 by circle is obtained. In this case, the relation between the measured value $ADC_{PB.measured}(x, y, z)$ and the theoretical-value $ADC_{PB.ideal}$ of the ADC value of a phantom-for-simultaneous-imaging can be linearly approximated with a linear model using coefficient K1, K2, k1, and k2, as expressed in equation (16-1) and (16-2).

$$ADC_{PB.measured} = K1 \cdot ADC_{PB.ideal} + K2 \quad (16-1)$$

$$ADC_{PB.ideal} = k1 \cdot ADC_{PB.measured} + k2 \quad (16-2)$$

If the spatial distribution of the measured value $ADC_{PB.measured}$ can be disregarded, scaling factor Kcor will be a slope k1 of the straight line expressed by equation (16-2). Therefore, scaling factor Kcor can be calculated by obtaining the straight line which passes along the origin from the measured value $ADC_{PB.measured}(x, y, z)$ of at least one ADC value and the theoretical-value $ADC_{PB.ideal}$.

In other words, scaling factor Kcor can be obtained, using equation (17), from at least one ADC value, i.e., one measured value $ADC_{PB.measured}$ and one theoretical-value $ADC_{PB.ideal}$ in a certain position.

$$K_{cor} = ADC_{PB.ideal}/ADC_{PB.measured} \quad (17)$$

On the other hand, when the spatial distribution of measured value $ADC_{PB.measured}$ of an ADC value cannot be disregarded, it is necessary to provide phantoms-for-simultaneous-imaging having a same ADC value in different positions. For example, when the spatial distribution of the measured value $ADC_{PB.measured}$ of the ADC value is second degree distribution, it is desirable to provide phantoms-for-simultaneous-imaging in three or more positions in one direction.

Figure 16:
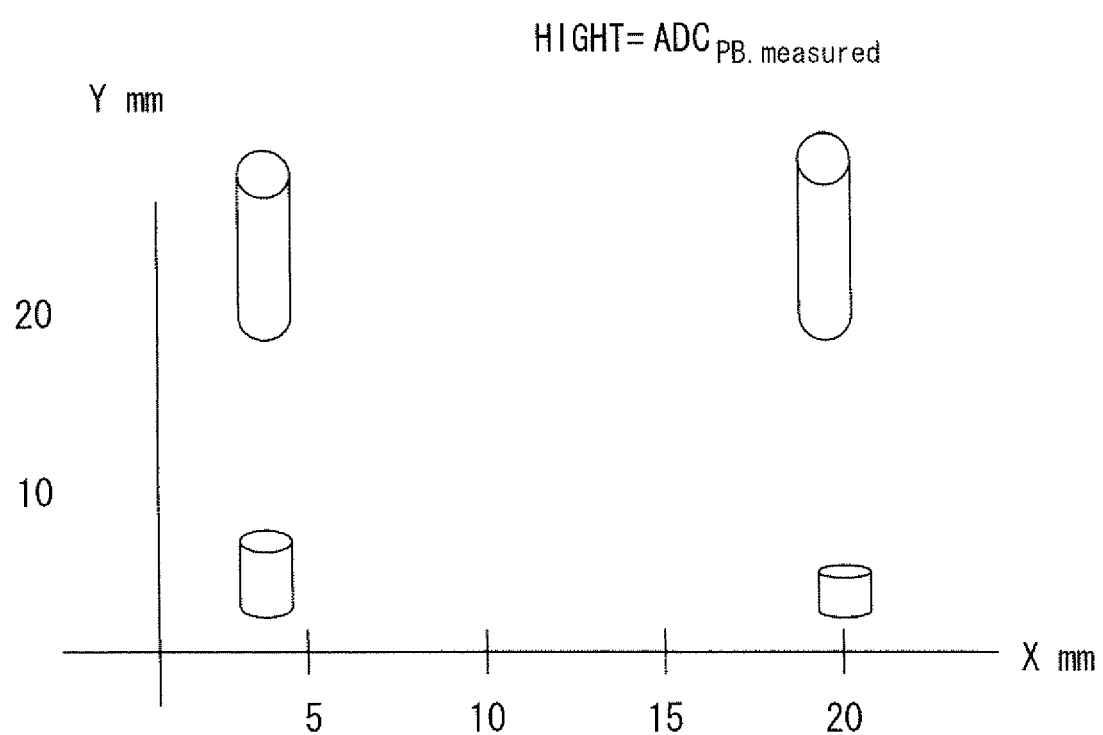
FIG. 16 is a figure showing an example in which measured ADC value, $ADC_{PB.measured}$ of the plural phantoms-for-simultaneous-imaging with the same ADC value has spatially non-uniform distribution.

FIG. 16 is a figure showing an example in which the measured ADC value $ADC_{PB.measured}$ of the plural phantoms-for-simultaneous-imaging having the same ADC value has spatially non-uniform distribution. In FIG. 16, a horizontal axis shows the position of an X axial direction, a vertical axis shows the position of Y axial direction, and the height of a bar graph shows the measured value ADCPB.measured of the ADC value, respectively.

In the case where the phantom-for-simultaneous-imaging each having the same ADC value is provided in the positions of the four corners of FOV as shown in FIG. 4 and FIG. 5, and if the measured value $ADC_{PB.measured}$ of the ADC value has spatial distribution, the measured value $ADC_{PB.measured}$ for each phantom-for-simultaneous-imaging shows a different value, as shown in FIG. 16.

In such a case, as shown in equation (18), from the measured value $ADC_{PB.measured}$ (x, y, z) and the theoretical-value $ADC_{PB.ideal}$ of the ADC value of the phantom-for-simultaneous-imaging at the n-th position (x, y, z), scaling factor $Kn_{cor}$(x, y, z) at the position (x, y, z) is obtained as a correction coefficient.

$$Kn_{cor}(x,y,z)=ADC_{PB.ideal}/ADC_{PB.measured}(x,y,z) \qquad (18)$$

Here, n indicates the identification number of the phantom-for-simultaneous-imaging.

The scaling factor $Kn_{cor}$(x, y, z) is calculated by equation (18) for each of N pieces of the phantoms-for-simultaneous-imaging. Applying an approximate expression to the obtained plural scaling factors $Kn_{cor}$(x, y, z) at N positions (x, y, z), spatially continuous scaling factor $Kn_{cor}$(x, y, z) can be obtained.

Figure 17:
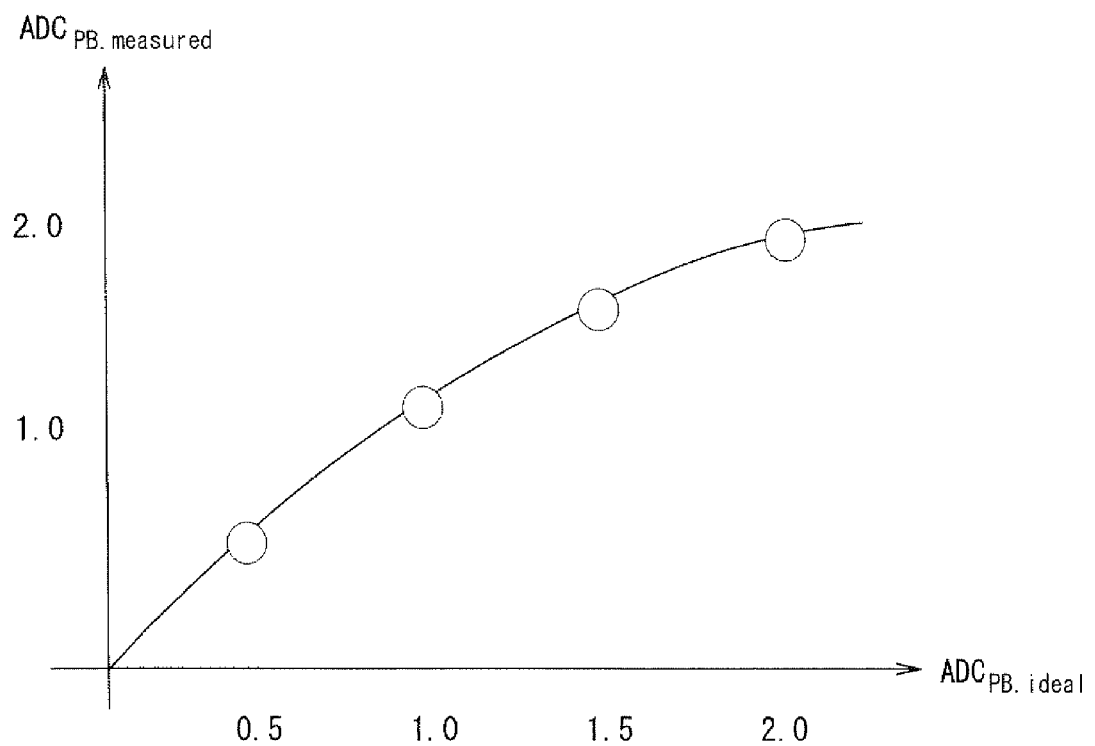
FIG. 17 is a figure showing an example, in which the theoretical ADC value and measured ADC value of a phantom-for-simultaneous-imaging show non-linear relation.

FIG. 17 is a figure showing an example in which the theoretical ADC value and measured ADC value of a phantom-for-simultaneous-imaging show non-linear relation. In FIG. 17, a horizontal axis shows theoretical-value $ADC_{PB.ideal}$ of the ADC value of the phantoms-for-simultaneous-imaging, and a vertical axis shows measured value $ADC_{PB.measured}$ of the ADC value of the phantoms-for-simultaneous-imaging in a certain position.

If the relation between the measured value $ADC_{PB.measured}$ (x, y, z) and the theoretical-value $ADC_{PB.ideal}$ of the phantoms-for-simultaneous-imaging is nonlinear, such plot data as shown in FIG. 17 is obtained. In this case, based on the measured values $ADC_{PB.measured}$ and theoretical-values $ADC_{PB.ideal}$ of plural ADC values of phantoms-for-simultaneous-imaging having different ADC values of which positional dependence can be disregarded, correction function $f$ of the ADC value can be obtained, as expressed in equation (19).

$$ADC_{PB.ideal}=f(ADC_{PB.measured}) \qquad (19)$$

Correction function $f$ can be determined from, for example, the second degree approximate expression show in equation (20-1) and equation (20-2). The correction function may determined by using 3rd or higher degree approximate expression.

$$ADC_{PB.measured}=M1 \cdot ADC_{PB.ideal}^2+M2 \cdot ADC_{PB.ideal} \qquad (20\text{-}1)$$

$$ADC_{PB.ideal}=m1 \cdot ADC_{PB.measured}^2+m2 \cdot ADC_{PB.measured} \qquad (20\text{-}2)$$

In equation (20-1) and equation (20-2), M1, M2, m1, and m2 are coefficients. Each coefficient M1, M2, m1, and m2 can be calculated by second degree fitting using the plural measured ADC values $ADC_{PB.measured}$.

When there is no spatial distribution in the measured ADC value $ADC_{PB.measured}$, plural reference phantoms 24B having different ADC values may be installed in different positions, as shown in FIG. 7, or a set of subphantom units 24I, each of the subphantom having different ADC value, may be installed in the substantially same position, as shown in FIG. 8. It is desirable not to arrange a human body in a PE (phase encoding) direction of the phantom-for-simultaneous-imaging as mentioned above, from a viewpoint of removing an artifact.

On the other hand, in the case that the measured ADC value $ADC_{PB.measured}$ has spatial distribution, installing the set of subphantom units 24I which has different ADC value in the substantially same position, as shown in FIG. 8, leads to processing simplification.

In this case, for example, scaling factor $Kn_{cor}$(x, y, z, ADC) can be calculated by the following methods. First, scaling factor Kncor (x, y, z) for each position (x, y, z) is calculated, from the measured ADC value $ADC_{PB.measured}$(x, y, z) and the theoretical-value $ADC_{PB.ideal}$(x, y, z) of the phantom-for-simultaneous-imaging in the n-th position (x, y, z), using equation (21) similar to equation (18).

$$Kn_{cor}(x,y,z,ADC)=ADC_{PB.ideal}(x,y,z)/ADC_{PB.measured}(x,y,z) \qquad (21)$$

Here, n is an identification number of the phantom-for-simultaneous-imaging. Then, each scaling factor $Kn_{cor}$(x, y, z, ADC) for each of the N phantom-for-simultaneous-imaging is calculated using equation (21). From the $Kn_{cor}$(x, y, z, ADC) for each of the calculated ADC values and N positions, spatially continuous scaling factor $Kn_{cor}$ (x, y, z, ADC) can be obtained, using an approximate expression.

On the other hand, in Step S15, the data processing unit 42, by conducting DWI analysis and/or DTI analysis, generates image data of the ADC value before correction $ADC_{measured}$ (x, y, z), i.e., the measured ADC value of a human body from the preset b value $b_{ideal}$ and at least two sets of human body image data $S_{DIcor}$(x, y, z) for b=0 and $S_{DIcor}$(x, y, z, b>0) for b>0 after distortion correction and signal strength correction, as expresses in equation (22).

$$ADC_{measured}(x,y,z)=\ln\{S_{DIcor}(x,y,z,b=0)/S_{DIcor}(x,y,z,b>0)\}/b_{ideal} \qquad (22)$$

Next, in Step S31, the data correction unit 43 acquires the ADC image data AD $ADC_{measured}$(x, y, z) of the human body before correction from the data processing unit 42 and corrects it using the correction coefficients, such as scaling factor $K_{cor}$.

For example, as expressed in equation (23-1), (23-2), or (23-3), the data correction unit 43 calculates the ADC image data A $ADC_{cor}$(x, y, z) of the human body after correction by multiplying the ADC image data $ADC_{measured}$ (x, y, z) of a human body by scaling factor $K_{cor}$.

$$ADC_{cor}(x,y,z)=K_{cor}*ADC_{measured}(x,y,z) \qquad (23\text{-}1)$$

$$ADC_{cor}(x,y,z)=K_{cor}(x,y,z)*ADC_{measured}(x,y,z) \qquad (23\text{-}2)$$

$$ADC_{cor}(x,y,z)=K_{cor}(x,y,z,ADC)*ADC_{measured}(x,y,z) \qquad (23\text{-}3)$$

Equation (23-1) corresponds to a correction processing for the case where relation between the measured value $ADC_{PB.measured}$ and the theoretical value $ADC_{PB.ideal}$ of the phantom-for-simultaneous-imaging is linear, while the measured ADC value $ADC_{PB.measured}$ does not have spatial distribution.

Equation (23-2) corresponds to a correction processing for the case where relation between the measured value $ADC_{PB.measured}$ and the theoretical value $ADC_{PB.ideal}$ of the phantom-for-simultaneous-imaging is linear, while the measured ADC value $ADC_{PB.measured}$ does have spatial distribution.

Equation (23-3) corresponds to a correction processing for the case where relation between the measured value $ADC_{PB.measured}$ and the theoretical value $ADC_{PB.ideal}$ of the ADC value of the phantom-for-simultaneous-imaging is nonlinear, while the measured ADC value $ADC_{PB.measured}$ has spatial distribution.

In addition, as shown in equation (20-2), the ADC image data $ADC_{cor}(x, y, z)$ of the human body after correction can also be calculated from the ADC image data $ADC_{measured}(x, y, z)$ using the correction function defined by two or more coefficients.

In this case, correction processing is not such a simple scaling processing, and the ADC image data $ADC_{cor}(x, y, z)$ of the human body after correction is sent to the data processing unit 42 from data correction unit 43 as correction data. Then, if needed, the data processing unit 42 calculates FA image data $FA_{cor}(x, y, z)$ based on ADC image data $ADC_{cor}(x, y, z)$ after correction and DWI image data $S_{DIBcor}(x, y, z\ b>0)$.

As shown in equation (12), FA image data $FA_{cor}(x, y, z)$ is calculated by diagonalizing symmetric matrix of 3×3 corresponding to the original ADC image data $ADC_{cor}(x, y, z)$ and using the elements λ1, λ2, and λ3 of the diagonalizied matrix and the A $ADC_{cor}(x, y, z)$.

In the above mentioned method for increasing the measurement accuracy of an ADC value, FA value, and a DWI image, correction coefficient for the ADC value of the human body, which is a final measurement parameter, is obtained using the image data of a phantom having a known ADC value, and then the ADC value of the human body is corrected with the obtained correction coefficient.

As mentioned above, the magnetic resonance imaging system 20 is configured to correct the physical quantity of measuring objects, such as a human body, using difference between a measured value and a theoretical value of a reference phantom, of which physical quantity, such as an ADC value, FA value, T1 value, T2 value, proton density, temperature, a chemical shift amount, blood flow volume, or oxygen concentration, is known.

In particular, the magnetic resonance imaging system 20 is configured to quantitatively measure an ADC value and FA value with high precision, using the DWI image in which shape distortion has been corrected.

According to the magnetic resonance imaging system 20, quantitative measurement of physical quantity, such as an ADC value, can be performed in a simpler manner and with higher precision compared with the previous technology.

For example, regardless of whether hardware is the same or it is updated, it is possible, when conducting DWI analysis and DTI analysis, to obtain an ADC image and FA image with high precision, without specifying the cause of the error of the b value.

Particularly, data correction for eliminating the influence of the eddy current previously needed in DWI now is not necessarily needed.

Further, data analysis or correction of shape distortion can be performed more easily compared with the case where only a human body is imaged, by using the image data of a reference phantom of which physical quantity such as an ADC value is known.

Furthermore, even when the measurement result of data has an error, an analysis of the error becomes possible, since the image of the phantom, whose physical quantity such as an ADC value and FA value is known, can be obtained together with the image of the human body.

In addition, since the special purpose receiving RF coil to which the reference phantom is fixed is used, a human body is easily arranged therein.

(Modification)

In the embodiment as mentioned above, the example is shown in which the receiving RF coil 24A and the phantom-for-simultaneous-imaging is not fixed to a human body but fixed to the bed 37 system, i.e., a gantry coordinate system. However, a phantom-for-simultaneous-imaging can also be fixed to a human body.

If a human body moves relatively to the bed 37, motion correction is needed in order to eliminate the influence of motion of the human body within echo time (TE). This motion correction is a known technique, in which the motion correction is performed to one frame or one set of image data for reducing a blur or a ghost. This motion correction can be performed in the data correction unit 43 of the computer 32.

However, when a phantom-for-simultaneous-imaging is fixed to a gantry coordinate system, in order to prevent generating of the artifact, it is necessary to remove, before motion correction, the phantom-for-simultaneous-imaging, which is in the gantry coordinate system and does not follow a motion of the human body, from FOV.

On the other hand, if a phantom-for-simultaneous-imaging is fixed to a human body coordinate system, it will become possible to cause the position of a phantom-for-simultaneous-imaging to follow a motion of a human body. As a result, even if a human body moves relatively to the bed 37, the data from the phantom-for-simultaneous-imaging which follows a motion of the human body can be corrected together with the data from a human body.

That is, if a phantom-for-simultaneous-imaging is fixed to a human body coordinate system, it is not necessary to remove a phantom-for-simultaneous-imaging from FOV before move correction, and the artifact by motion correction of a human body can be further reduced compared with the case where a phantom-for-simultaneous-imaging is fixed to a gantry coordinate system.

In DWI of the head, accompanied by a strong gradient magnetic field and a motion of an imaging region, the influence of a motion of a human body is particularly significant.

However, the amount of variation of the spatial distribution of a gradient magnetic field or an eddy current according to the relative movement of the head to bed 37 is negligibly small compared with the amount of variation of the nonlinearity of a gradient magnetic field, or the spatial distribution of an eddy current.

Therefore, even in DWI which requires motion correction, the data correction in which the above mentioned ADC nonlinearity correction is included can be easily applied, if a phantom-for-simultaneous-imaging is fixed to a human body coordinate system.

In this case, transmitting RF coil 24 and/or the receiving RF coil 24A are also fixed to a human body coordinate system. If the transmitting RE coil 24 and/or the receiving RE coil 24A are fixed to a human body coordinate system together with a phantom-for-simultaneous-imaging, the accuracy of move correction can be increased, since the movement the phantom-for-simultaneous-imaging against the transmitting RE coil 24 and/or the receiving RE coil 24A can also be suppressed sufficiently.

On the other hand, if the transmitting RE coil 24 and/or the receiving RE coil 24A are fixed to a gantry coordinate system, while the phantom-for-simultaneous-imaging is fixed to a human body coordinate system, more comfortable environment may be obtained.

Figure 18:
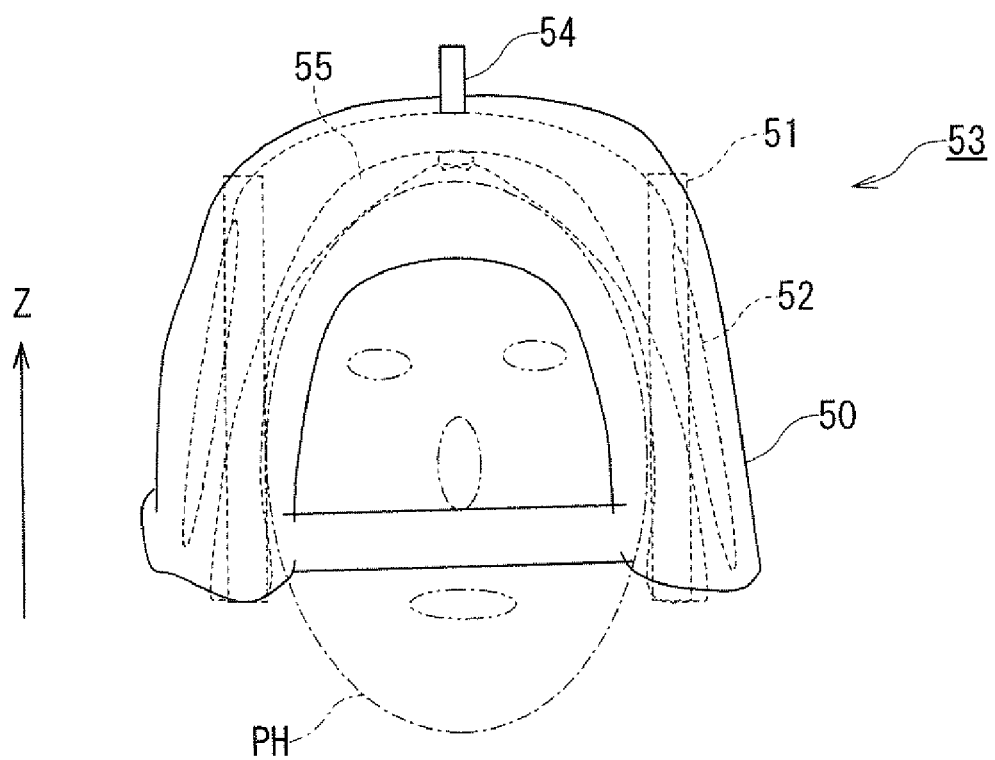
FIG. 18 is a figure showing an example of a receiving RF coil unit in which the phantom-for-simultaneous-imaging and the receiving RF coil are fixed to the head of a human body.
Figure 19:
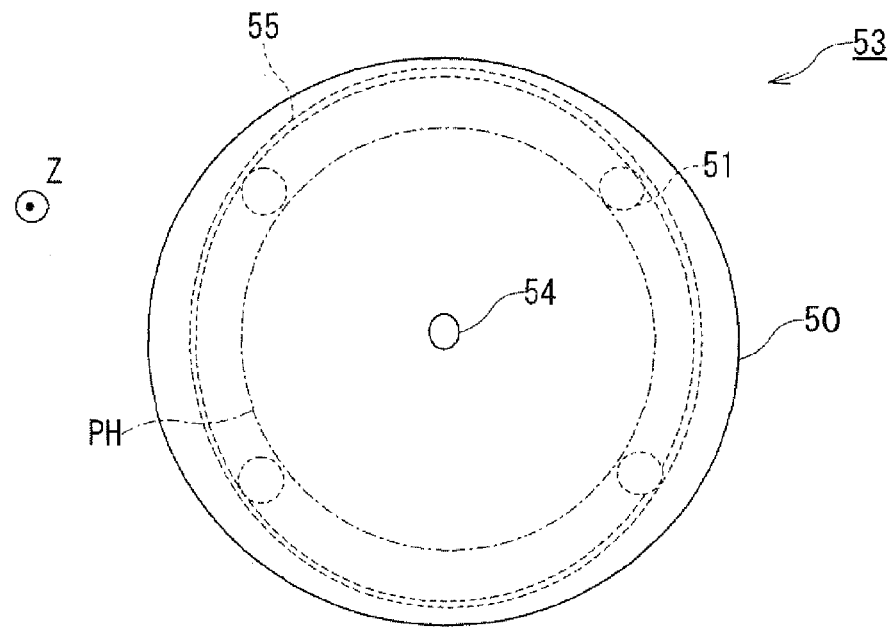
FIG. 19 is a top plan view of the receiving RF coil unit shown in FIG. 18.
Figure 20:
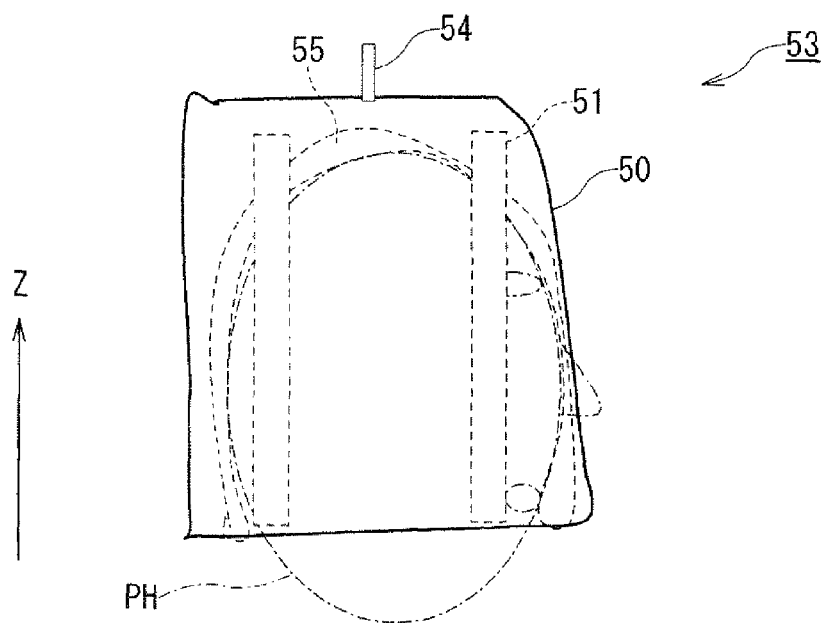
FIG. 20 is a side view of the receiving RF coil unit shown in FIG. 18.

FIG. 18 is a front view showing an example of a receiving RE coil unit 53 in which the phantom-for-simultaneous-imaging 51 and the receiving RE coil 52 are fixed to the head of a human body. FIG. 19 is a top plan view of the receiving RE coil unit 53 shown in FIG. 18. FIG. 20 is a side view of the receiving RE coil unit 53 shown in FIG. 18.

As shown in FIGS. 18-20, the receiving RE coil unit 53 is configured to fix at least one of the phantoms-for-simultaneous-imaging 51 and the receiving RF coils 52 to a frame 50.

A radio antenna 54 for transmitting the received RF signal via radio waves to the receiver 30 of the control system 25 is connected to the output of the receiving RF coil 52. In this configuration, a radio antenna for receiving the RF signal transmitted from the receiving RE coil 52 via the radio antenna 54 is also connected to the receiver 30. Thus, a signal cable between the receiving RF coil 52 and the receiver 30 is not needed, and therefore the receiving RF coil unit 53 and a human body can be moved freely in a gantry to some extent.

The frame 50 has a shape of a cap or a shape of a hardhat so that a head PH of the human body can be accommodated. The frame 50 is preferably made of rigid material such as that of the typical hardhat, from a viewpoint of strength and position fixation.

On the other hand, inside frame 50, soft foaming material 55 is used for fitting the head PH. The foaming material 55 may be string-like material which can be twisted around the head PH, not only cushion-like material such as the foaming material.

By using the foaming material 55, depending on the various shape and size of head PH for each person, the frame 50 can be fitted to the head PH with high flexibility. That is, the individual difference of the shape and size of the head PH for each person can be absorbed by using the foaming material.

Thus, the receiving RF coil unit 53 can be fitted and fixed to the head PH of a person as if he puts on a cap, and therefore, even if the head PH moves, the receiving RF coil unit 53 and the head PH can be treated as a single rigid body. That is, the whole receiving RF coil unit is fixed to the head coordinate system, and moves to follow a motion of the head PH.

Inside of the frame 50, the phantom-for-simultaneous-imaging 51 is embedded, for example, i.e., the frame 50, the receiving RF coil 52, and the phantom-for-simultaneous-imaging 51 are integrated. As a result, the individual difference of the position of the phantom-for-simultaneous-imaging 51 to the head PH of is eliminated, and the position of the phantom-for-simultaneous-imaging 51 can be identified without recognition of the phantom-for-simultaneous-imaging 51 by image processing.

In FIG. 18, an example is shown in which four pillar-shaped phantoms-for-simultaneous-imaging 51 are arranged in Z axial direction, i.e., the direction of a body (HEAD-FEET) axis.

The frame 50 may be made of thin and flexible material extended along with an electrically conductive pattern of the receiving RF coil 52, instead of the rigid material. For this configuration, the whole receiving RF coil unit 53 can also be fixed to the head coordinate system of a human body by putting the frame 50 freely on the head PH having various shape and size, as if the frame 50 were a cap.

However, the position of the phantom-for-simultaneous-imaging 51 to the head PH may be slightly shifted depending on how the frame 50 is putted on. Then, in the data correction unit 43 of the computer 32, three-dimensional image processing for recognizing the phantom-for-simultaneous-imaging 51 may be performed to detect the position thereof.

Figure 21:
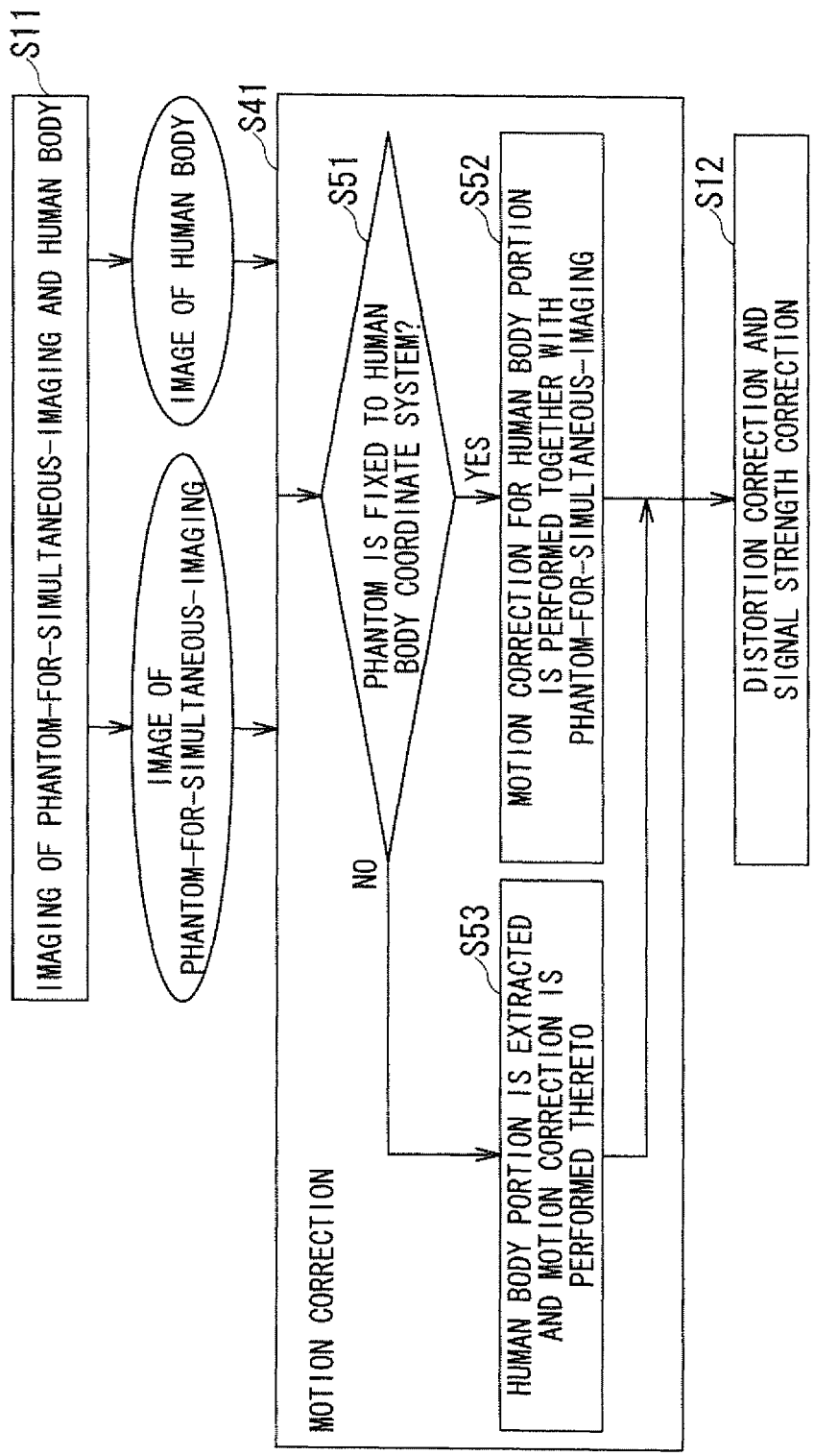
FIG. 21 is a flow chart which shows process for performing the motion correction of image data in the process of the flow chart shown in FIG. 10 or FIG. 14.

FIG. 21 is a flow chart in which motion correction of image data is performed in the flow shown in FIG. 10 or FIG. 14. As shown in FIG. 21, after imaging of the phantom-for-simultaneous-imaging and the human body is performed in Step S11, motion correction of image data can be performed in Step S41.

Specifically, in Step S51, it is determined whether or not the phantom-for-simultaneous-imaging is fixed to the human body coordinate system. This determination can be performed in the data correction unit 43 of the computer 32, but it is not necessary to actually determine in the computer 32.

If the phantom-for-simultaneous-imaging is not fixed to the human body coordinate system, a human body portion is extracted from the image data, in Step S53, and then motion correction of the extracted human body image data is performed in the data correction unit 43.

If the image data is an image data after image reconstruction, a human body portion is easily separated spatially from a phantom-for-simultaneous-imaging portion. Therefore, it is possible to extract only a human body portion from image data, and the extracted human body portion is the target of motion correction.

For example, a region of interest (ROI) for a human body portion is automatically set by the threshold processing to image data, and the image data in the set ROI can be extracted as human body image data. For the case that the phantom-for-simultaneous-imaging is fixed to the gantry coordinate system, the position and region of the phantom-for-simultaneous-imaging are known. Thus, using the position and region information of the phantom-for-simultaneous-imaging, a region other than the phantom-for-simultaneous-imaging also can be extracted.

Alternatively, the image data acquired by imaging may be displayed on the display 34, and the human body image data may be extracted manually by operating the input device 33.

Specifically, the echo signals for measuring motion amount are acquired together with imaging data, without any phase encoding, or with smaller phase encoding than normal phase encoding in usual image data acquisition. And then, the position of image data is shifted by only an amount equivalent to the measured motion amount based on the acquired echo signals, thereby enabling to perform the motion correction. The motion amount is also can be acquired using a motion sensor.

When the motion amount has two-dimensional or three-dimensional spatial distribution, the position of image data for each pixel in image space is corrected.

For the case where the motion amount has one-dimensional (for example, projection direction) distribution, inverse FT for only the data of the phantom-for-simultaneous-imaging portion may be performed in a certain dimension (for example, a projection direction and a perpendicular direction). Thereafter, motion correction is performed. After the motion correction, FT is performed again.

On the other hand, when the phantom-for-simultaneous-imaging is fixed to the human body coordinate system, in Step S51, motion correction of the image data which contains a human body portion and a phantom-for-simultaneous-imaging portion is performed in the data correction unit 43, in Step S52. That is, motion correction of the human body portion can be performed together with the phantom-for-simultaneous-imaging portion, without extracting the human body portion.

While certain embodiments have been described, these embodiments have been presented by way of example only, and are not intended to limit the scope of the invention. Indeed, the novel apparatuses and units described herein may be embodied in a variety of other forms; furthermore, various omissions, substitutions and changes in the form of the apparatuses and units described herein may be made without departing from the spirit of the invention. The accompanying claims and their equivalents are intended to cover such forms or modifications as would fall within the scope and spirit of the invention.

What is claimed is:

1. A magnetic resonance imaging apparatus comprising:
a correction data acquisition unit configured to perform diffusion weighted imaging to a phantom having a known apparent diffusion coefficient and measure an apparent diffusion coefficient of the phantom to acquire correction data from a measured apparent diffusion coefficient and the known apparent diffusion coefficient; and
an image generating unit configured to perform diffusion weighted imaging to an object with a same parameter setting as that of the diffusion weighted imaging to the phantom to generate an apparent diffusion coefficient image from a diffusion weighted imaging data of the object and the correction data.

2. The magnetic resonance imaging system according to claim 1, wherein,
said image generating unit further generates fractional anisotropy image from the diffusion weighted imaging data and the correction data.

3. The magnetic resonance imaging system according to claim 1, wherein,
the phantom has the substantially same size as an imaging region of the object, and
said correction data acquisition unit performs the diffusion weighted imaging to the phantom independently of the diffusion weighted imaging to the object, and acquires the correction data.

4. The magnetic resonance imaging system according to claim 3, wherein,
the phantom has a known apparent diffusion coefficient having a spatially uniform distribution,
said correction data acquisition unit acquires the correction data which corrects an error depending on spatial positions of the imaging region, using an error between a spatial distribution of the measured apparent diffusion coefficient of the phantom and the spatially uniform distribution of the known apparent diffusion coefficient of the phantom unit, and
said image generating unit generates the apparent diffusion coefficient image of the object depending on the spatial positions, by using the correction data.

5. The magnetic resonance imaging system according to claim 1, wherein,
the phantom is arranged in the circumference of the object, and
said correction data acquisition unit performs the diffusion weighted imaging to the phantom simultaneously with the object, and acquires the correction data.

6. The magnetic resonance imaging system according to claim 1, wherein,
the phantom is configured to have a plurality of phantom units arranged in different positions in the circumference of the object, and
said correction data acquisition unit performs the diffusion weighted imaging to the phantom simultaneously with the object, and acquires the correction data.

7. The magnetic resonance imaging system according to claim 6, wherein,
each of the phantom units has the known apparent diffusion coefficient of the same value,
said correction data acquisition unit acquires the correction data which corrects an error depending on spatial positions of the imaging region, the error having zeroth or first degree distribution function, using an error between the measured apparent diffusion coefficient of each of the phantom units and the known apparent diffusion coefficient of each of the phantom units, and
said image generating unit generates the apparent diffusion coefficient image of the object which is corrected depending on the spatial positions, by using the correction data.

8. The magnetic resonance imaging system according to claim 6, wherein,
each of the phantom units has a known apparent diffusion coefficient of a value different from each other,
said correction data acquisition unit acquires the correction data which corrects an error depending on a magnitude of the apparent diffusion coefficient, using an error between the measured apparent diffusion coefficient of each of the phantom units and the known apparent diffusion coefficient of each of the phantom units, and
said image generating unit generates the apparent diffusion coefficient image of the object which is corrected depending on the magnitude of the apparent diffusion coefficient, by using the correction data.

9. The magnetic resonance imaging system according to claim 8, wherein,
the error depending on the magnitude of the apparent diffusion coefficient is an error resulting from a nonlinear relation between a current value applied to a gradient coil and a magnitude of a gradient magnetic field.

10. The magnetic resonance imaging system according to claim 6, wherein,
each of the phantom units is configured to have a plurality of subphantom units, each of the subphantom units having a known apparent diffusion coefficient of a value different from each other and being arranged close to each other,
said correction data acquisition unit acquires the correction data which corrects an error depending on spatial positions of the imaging region, the error having zeroth or first degree distribution function, using an error between the measured apparent diffusion coefficient of each of the phantom units and the known apparent diffusion coefficient of each of the phantom units, and corrects an error depending on a magnitude of the apparent diffusion coefficient, using an error between the measured apparent diffusion coefficient of each of the subphantom units and the known apparent diffusion coefficient of each of the subphantom units, and
said image generating unit generates the apparent diffusion coefficient image of the object which is corrected depending on the spatial positions and the magnitude of the apparent diffusion coefficient, by using the correction data.

11. The magnetic resonance imaging system according to claim 1, wherein,
the phantom is configured to have a plurality of first phantoms arranged in different positions in the circumference of the object, and a second phantom which has a substantially same size as an imaging region of the object and has an apparent diffusion coefficient having a spatially uniform distribution,
said correction data acquisition unit performs a first diffusion weighted imaging to the first phantoms simultaneously with the object to acquire a first correction data, and performs a second diffusion weighted imaging to the second phantom independently of the first diffusion weighted imaging to the object to acquire a second correction data, and the image generating unit generates the apparent diffusion coefficient image of the object from a diffusion weighted imaging data of the object acquired with the first diffusion weighted imaging, and the first and the second correction data.

12. The magnetic resonance imaging system according to claim 11, wherein, the first correction data is a correction data obtained from an error between the apparent diffusion coefficient measured in each position of the first phantoms and the known apparent diffusion coefficient, the second correction data is a correction data obtained from an error between a spatial distribution of the measured apparent diffusion coefficient of the second phantom and the spatially uniform distribution of the known apparent diffusion coefficient of the second phantom, the error depending on spatial positions of the imaging region and having second or higher degree distribution function, and said image generating unit corrects the second correction data so that the second correction data coincides with the first correction data at positions of the first phantoms, and generates the apparent diffusion coefficient image of the object corrected depending on the spatial positions using the corrected second correction data.

13. The magnetic resonance imaging system according to claim 1, wherein, the correction data is expressed as a ratio of the measured apparent diffusion coefficient and the known apparent diffusion coefficient.

14. The magnetic resonance imaging system according to claim 1, wherein, the correction data is expressed as a b value which is a parameter associating a signal strength S of diffusion weighted imaging data with an apparent diffusion coefficient ADC.

15. An RF coil unit, comprising:
a phantom with a known apparent diffusion coefficient;
a receiving RF coil configured to receive magnetic resonance signal from an imaging object including said phantom and a object; and
a fixing unit configured to fix said phantom to said receiving RF coil.

16. The RF coil unit according to claim 15, wherein,
said phantom has a size which covers a field of view.

17. The RF coil unit according to claim 15, wherein,
said phantom is configured to have a plurality of phantom units.

18. The RF coil unit according to claim 17, wherein,
each of said phantom units is arranged in the circumference of region for setting the imaging object inside said receiving RF coil.

19. The RF coil unit according to claim 17, wherein,
said phantom unit is arranged in such position that a ghost artifact in a phase encoding direction does not occur.

20. The RF coil unit according to claim 17, wherein,
each of the phantom units has the apparent diffusion coefficient of a value different from each other.

21. The RF coil unit according to claim 17, wherein,
each of the phantom units is configured to have a plurality of subphantom units, each of the subphantom units having a known apparent diffusion coefficient of a value different from each other and being arranged in a substantially same position.

22. The RE coil unit according to claim 17, wherein,
each of the phantom units has the known apparent diffusion coefficient of the same value, and number of the phantom units corresponds to degree of spatial distribution function of the measured apparent diffusion coefficient.

23. The RE coil unit according to claim 15, wherein,
said phantom has an apparent diffusion coefficient close to an apparent diffusion coefficient of the object.

24. The RE coil unit according to claim 15, wherein,
said phantom has a resonant frequency equivalent to a resonant frequency of water, 25. The RE coil unit according to claim 17, wherein,
said phantom is formed in a pillar shape such that a longitudinal direction thereof corresponds to a direction of a body axis of the object.

26. The RE coil unit according to claim 17, wherein,
said fixing means is configured to fix said phantom unit to a human body coordinate system.

27. The RF coil unit according to claim 26, further comprising:
an antenna configured to wirelessly transmit a magnetic resonance signal received by said receiving RE coil.

28. An RE coil unit, comprising:
a phantom with a known apparent diffusion coefficient;
a receiving RF coil configured to receive a magnetic resonance signal from an imaging object including said phantom and a object; and
a fixing unit configured to fix said phantom to a human body coordinate system.

* * * * *